(12) United States Patent
Kawashima et al.

(10) Patent No.: US 8,305,802 B2
(45) Date of Patent: Nov. 6, 2012

(54) SEMICONDUCTOR DEVICE AND METHOD OF MANUFACTURING THE SAME

(75) Inventors: Yoshiyuki Kawashima, Kanagawa (JP); Takashi Hashimoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 193 days.

(21) Appl. No.: 12/910,788

(22) Filed: Oct. 23, 2010

(65) Prior Publication Data
US 2011/0110156 A1 May 12, 2011

(30) Foreign Application Priority Data
Nov. 10, 2009 (JP) ................................. 2009-257100

(51) Int. Cl.
*G11C 11/34* (2006.01)
(52) U.S. Cl. ................... 365/174; 365/182; 365/185.01; 365/183; 365/185.08
(58) Field of Classification Search .................. 365/174, 365/182, 185.01, 183, 185.08
See application file for complete search history.

(56) References Cited

U.S. PATENT DOCUMENTS
7,012,295 B2 * 3/2006 Sato et al. ................ 365/185.01
2003/0198086 A1 10/2003 Shukuri

FOREIGN PATENT DOCUMENTS
JP 2000-138300 A 5/2000
JP 2003-309193 A 10/2003

* cited by examiner

*Primary Examiner* — Thong Q Le
(74) *Attorney, Agent, or Firm* — Miles & Stockbridge P.C.

(57) ABSTRACT

There is provided a technology which can allow a semiconductor chip formed with a nonvolatile memory to be sufficiently reduced in size. There is also provided a technology which can ensure the reliability of the nonvolatile memory. In a memory cell of the present invention, a boost gate electrode is formed over a control gate electrode via an insulating film. The boost gate electrode has the function of boosting a voltage applied to a memory gate electrode through capacitive coupling between the boost gate electrode and the memory gate electrode. That is, during a write operation or an erase operation to the memory cell, a high voltage is applied to the memory gate electrode and, to apply the high voltage to the memory gate electrode, the capacitive coupling using the boost gate electrode is subsidiarily used in the present invention.

26 Claims, 22 Drawing Sheets

FIG. 10

|   | VBG | VMG | VS | VCG | VD |
|---|---|---|---|---|---|
| SL | 8 | 8 | 5 | 1 | 0.5 |
| A | 8 | 8 | 5 | 1 | 1.5 |
| B | 8 | 8 | 5 | 0 | 0.5 |
| C | 8 | 8 | 5 | 0 | 1.5 |

FIG. 12

|    | VBG | VMG | VS | VCG | VD  |
|----|-----|-----|----|-----|-----|
| SL | 8   | 8   | 5  | 1   | 0.5 |
| A  | 8   | 8   | 5  | 1   | 1.5 |
| B  | 8   | 3.5 | 5  | 0   | 0.5 |
| C  | 8   | 3.5 | 5  | 0   | 1.5 |
| D  | 8   | 3.5 | 5  | 0   | 0.5 |
| E  | 8   | 3.5 | 5  | 0   | 1.5 |
| F  | 8   | 8   | 5  | 0   | 0.5 |
| G  | 8   | 8   | 5  | 0   | 1.5 |

FIG. 13

|             | VBG | VMG | VS | VCG | VD  |
|-------------|-----|-----|----|-----|-----|
| FN ERASING  | 10  | 10  | 0  | 0   | 0   |
| BTBT ERASING| 0   | -6  | 6  | 0   | 1.5 |

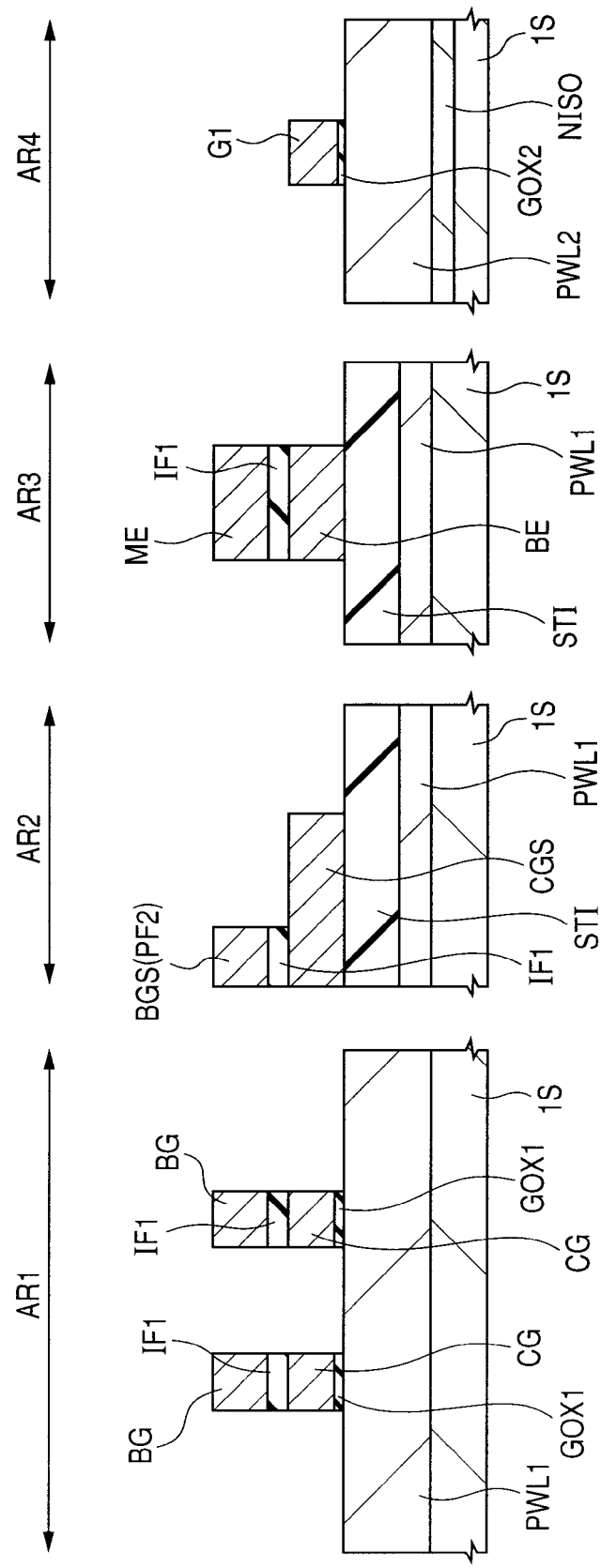

SEMICONDUCTOR DEVICE AND METHOD OF MANUFACTURING THE SAME

CROSS-REFERENCE TO RELATED APPLICATIONS

The disclosure of Japanese Patent Application No. 2009-257100 filed on Nov. 10, 2009 including the specification, drawings and abstract is incorporated herein by reference in its entirety.

BACKGROUND OF THE INVENTION

The present invention relates to a semiconductor device and a method of manufacturing the same, and particularly to a technology which is effective when applied to a semiconductor device having an electrically rewritable nonvolatile memory and a technique for manufacturing the same.

In Japanese Unexamined Patent Publication No. 2000-138300 (Patent Document 1), a structure of a nonvolatile memory is disclosed in which pull-up gates are provided over each of word lines. In the nonvolatile memory, after a word line is precharged with 8 V in advance during a write operation, the word line is brought into a floating state. Thereafter, 8 V is applied to a pull-up gate to boost the voltage of the word line.

In Japanese Unexamined Patent Publication No. 2003-309193 (Patent Document 2), a split-gate nonvolatile memory is described in which the height of a control gate is set lower than the height of a memory gate electrode.

PRIOR ART DOCUMENTS

[Patent Documents]
[Patent Document 1]
Japanese Unexamined Patent Publication No. 2000-138300
[Patent Document 2]
Japanese Unexamined Patent Publication No. 2003-309193

SUMMARY OF THE INVENTION

As electrically writable/erasable nonvolatile semiconductor memory devices, an Electrically Erasable and Programmable Read Only Memory (EEPROM) and a flash memory are widely used. Each of these nonvolatile semiconductor memory devices (nonvolatile memories) represented by the currently widely used EEPROM and flash memory has a charge accumulation film such as a conductive floating gate electrode or a trapping insulating film surrounded by a silicon dioxide film under the gate electrode of a Metal Oxide Semiconductor (MOS) transistor, and stores therein information using the phenomenon in which the threshold voltage of a transistor varies depending on the state of charge accumulation in the floating gate electrode or the trapping insulating film.

The trapping insulating film refers to an insulating film having a trap level which allows charges accumulation. As an example thereof, a silicon nitride film or the like can be listed. In a nonvolatile semiconductor memory device having a trapping insulating film, the threshold voltage of a MOS transistor is shifted through injection/release of charges into the trapping insulating film so that the MOS transistor is caused to operate as a memory element. A nonvolatile semiconductor memory device using such a trapping insulating film as a charge accumulation film is referred to as a Metal Oxide Nitride Oxide Semiconductor (MONOS) transistor. Compared with the case where a conductive floating gate electrode is used as a charge accumulation film, data retention reliability is excellent because charges are accumulated at the discrete trap level. In addition, due to the excellent data retention reliability, there are advantages such that the thicknesses of silicon dioxide films over and under the trapping insulating film can be reduced and a voltage for a write/erase operation can be reduced.

As an example of such a MONOS transistor, there is a split-gate nonvolatile memory. In the split-gate nonvolatile memory, a memory transistor storing therein information is formed over a side wall of a selection transistor for selecting a memory cell. Specifically, a control gate electrode is formed over a semiconductor substrate via a gate insulating film, and a memory gate electrode is formed over a side wall of the control gate electrode via a multilayer insulating film including a charge accumulation film.

In the split-gate nonvolatile memory, during a write operation of writing information or an erase operation of erasing information, a voltage having a large absolute value is applied to the memory gate electrode. That is, in a nonvolatile memory represented by the split-gate nonvolatile memory, a voltage having a large absolute value is used during a write operation or an erase operation. Accordingly, a control circuit for causing the nonvolatile memory to operate is formed in a semiconductor chip formed with the nonvolatile memory, and a voltage boosting circuit for generating the voltage having the large absolute value that is used in the write operation or the erase operation exists as a part of the control circuit.

In recent years, a reduction in the size of a semiconductor chip has been demanded and, to respond to the demand, the miniaturization of a nonvolatile memory formed in the semiconductor chip has been promoted. By the miniaturization of the nonvolatile memory, the miniaturization of a memory cell has been promoted, but the size reduction of the voltage boosting circuit forming a part of a peripheral circuit has not been sufficiently promoted. A conceivable reason for this may be that the operation voltage of the nonvolatile memory cannot be lowered. That is, in the nonvolatile memory, the high voltage having the large absolute value is required during the write operation or the erase operation, and therefore the size reduction of the voltage boosting circuit cannot be sufficiently promoted. This is because the voltage boosting circuit for generating the high voltage having the large absolute value needs to have a structure such that a high-breakdown-voltage MISFET that can withstand a high voltage is used to increase the thickness of the gate insulating film. As a result, it is necessarily difficult to reduce the size of the high-breakdown-voltage MISFET forming the voltage boosting circuit. Thus, in the nonvolatile memory, the high voltage having the large absolute value is used as the operation voltage thereof, and therefore the size of the voltage boosting circuit of which a high breakdown voltage is required cannot be reduced. This results in the problem that the semiconductor chip formed with the nonvolatile memory cannot be sufficiently reduced in size.

An object of the present invention is to provide a technology which can allow a semiconductor chip formed with a nonvolatile memory to be sufficiently reduced in size.

Another object of the present invention is to ensure the reliability of the nonvolatile memory.

The above and other objects and novel features of the present invention will become apparent from a statement in the present specification and the accompanying drawings.

The following is a brief description of the outline of a representative aspect of the invention disclosed in the present application.

A semiconductor device in a representative embodiment includes a memory cell formed over a memory cell formation area of a semiconductor substrate. The memory cell has (a) the semiconductor substrate, (b) a first gate insulating film formed over the semiconductor substrate, (c) a control gate electrode formed over the first gate insulating film, and (d) a first insulating film formed over the control gate electrode. The memory cell also has (e) a boost gate electrode formed over the first insulating film, (f) a first potential barrier film formed over respective side walls of the control gate electrode and the boost gate electrode and over the semiconductor substrate, and (g) a charge accumulation film formed over the first potential barrier film. Further, the memory cell has (h) a second potential barrier film formed over the charge accumulation film, (i) a memory gate electrode formed over the second potential barrier film, (j) a first source region formed in the semiconductor substrate, and (k) a first drain region formed in the semiconductor substrate. At this time, a height of a surface of the control gate electrode from a surface of the semiconductor substrate is lower than a height of a surface of the memory gate electrode from the surface of the semiconductor substrate.

A method of manufacturing a semiconductor device in a representative embodiment includes the steps of (a) forming a first gate insulating film over a semiconductor substrate, (b) forming a first conductive film over the first gate insulating film, and (c) forming a first insulating film over the first conductive film. The method also has the steps of (d) forming a second conductive film over the first insulating film, and (e) processing the second conductive film, the first insulating film, the first conductive film, and the first gate insulating film to form a boost gate electrode including the second conductive film and a control gate electrode including the first conductive film. The method subsequently has the steps of (f) after the step (e), forming a multilayer insulating film including a charge accumulation film over the semiconductor substrate, and (g) forming a third conductive film over the multilayer insulating film. The method subsequently has the steps of (h) performing anisotropic etching to the third conductive film to form a memory gate electrode including the third conductive film over respective side walls of the control gate electrode and the boost gate electrode and over the semiconductor substrate each via the multilayer insulating film, and (i) forming a source region and a drain region in the semiconductor substrate.

The following is a brief description of effects achievable by the representative aspect of the invention disclosed in the present application.

The semiconductor chip formed with the nonvolatile memory can be sufficiently reduced in size.

In addition, the reliability of the nonvolatile memory can be ensured.

BRIEF DESCRIPTION OF THE DRAWINGS

FIG. 10 is a table showing an example of conditions for voltages applied to the plurality of memory cells during a write operation;

FIG. 12 is a table showing another example of the conditions for the voltages applied to the plurality of memory cells during the write operation;

FIG. 13 is a table showing an example of conditions for the voltages during an erase operation;

FIG. 25 is a cross-sectional view showing a process step of manufacturing the semiconductor device, which is subsequent to FIG. 24.

DESCRIPTION OF THE PREFERRED EMBODIMENTS

Figure 1:
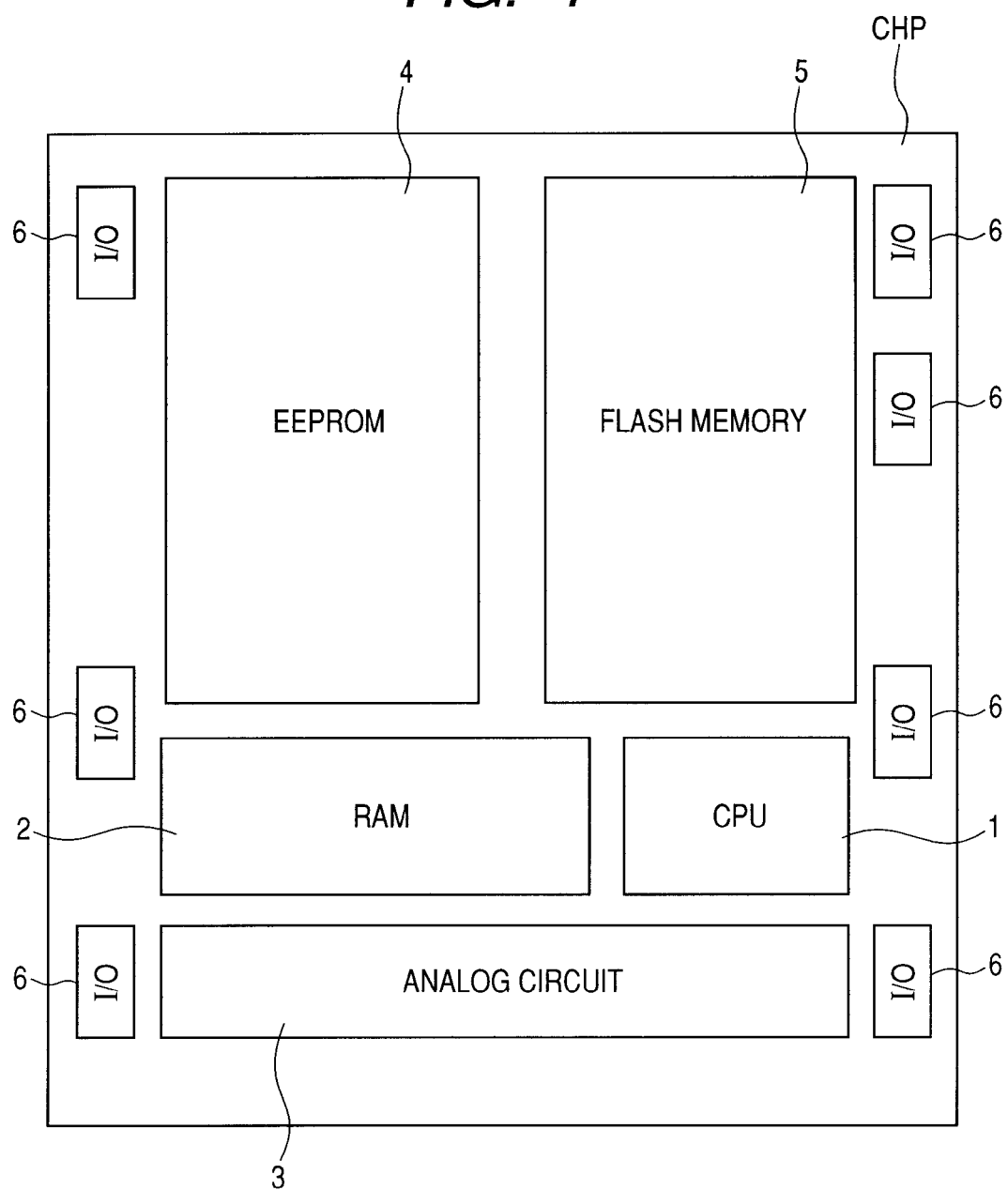
FIG. 1 is a view showing a layout configuration of a semiconductor chip in Embodiment 1 of the present invention.

In each of the following embodiments, if necessary for the sake of convenience, the embodiment will be described by being divided into a plurality of sections or embodiments.

However, they are by no means irrelevant to each other unless particularly explicitly described otherwise, and one of the sections or embodiments is variations, details, supplementary explanation, and so forth of part or the whole of the others.

When the number and the like (including the number, numerical value, amount, and range thereof) of elements are referred to in the following embodiments, they are not limited to specific numbers unless particularly explicitly described otherwise or unless they are obviously limited to specific numbers in principle. The number and the like of the elements may be not less than or not more than specific numbers.

It will be appreciated that, in the following embodiments, the components thereof (including also elements, steps, and the like) are not necessarily indispensable unless particularly explicitly described otherwise or unless the components are considered to be obviously indispensable in principle.

Likewise, if the shapes, positional relationship, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

Throughout the drawings for illustrating the embodiments, like members will be provided with like reference numerals in principle, and a repeated description thereof will be omitted. Note that even a plan view may be hatched for clarity of illustration.

(Embodiment 1)

A semiconductor device having a nonvolatile memory in Embodiment 1 will be described with reference to the drawings. First, a description will be given of a layout configuration of a semiconductor device (semiconductor chip) formed with a system including a nonvolatile memory. FIG. 1 is a view showing a layout configuration of a semiconductor chip CHP in Embodiment 1. In FIG. 1, the semiconductor chip CHP has a Central Processing Unit (CPU) 1, a Random Access Memory (RAM) 2, an analog circuit 3, an Electrically Erasable Programmable Read Only Memory (EEPROM) 4, a flash memory 5, and Input/Output (I/O) circuits 6, and forms a semiconductor integrated circuit device.

The CPU (circuit) 1 is referred to also as a central processing unit, and corresponds to the heart of a computer or the like. The CPU 1 reads an instruction from a memory device, decodes the instruction, and performs various arithmetic operations and control based thereon.

The RAM (circuit) 2 is a memory from which stored information can be read randomly, i.e., as necessary and in which information to be stored can be newly written, and is referred to also as a randomly writable/readable memory. RAMs as IC memories include two types, which are a Dynamic RAM (DRAM) using a dynamic circuit and a Static RAM (SRAM) using a static circuit. The DRAM is a random write/read memory which requires a storage retaining operation, while the SRAM is a random write/read memory which does not require a storage retaining operation.

The analog circuit 3 processes a signal representing a continuously time varying voltage or current, i.e., an analog signal, and includes, e.g., an amplification circuit, a conversion circuit, a modulation circuit, an oscillation circuit, a power source circuit, and the like.

Each of the EEPROM 4 and the flash memory 5 is a type of a nonvolatile memory which is electrically rewritable in each of a write operation and an erase operation, and is referred to also as an electrically erasable programmable read only memory. Each of the memory cells of the EEPROM 4 and the flash memory 5 is formed of, e.g., a Metal Oxide Nitride Oxide Semiconductor (MONOS) transistor or a Metal Nitride Oxide Semiconductor (MNOS) transistor for a storage (memory) purpose. For a write operation and an erase operation to the EEPROM 4 and the flash memory 5, for example, a Fowler-Nordheim tunneling phenomenon is used. Note that a write operation and an erase operation can also be performed using hot electrons and hot holes. The difference between the EEPROM 4 and the flash memory 5 is that the EEPROM 4 is a nonvolatile memory which allows erasing on a per, e.g., byte basis, while the flash memory 5 is a nonvolatile memory which allows erasing on a per, e.g., word-line basis. In general, in the flash memory 5, a program for executing various processing and the like in the CPU 1 are stored. By contrast, in the EEPROM 4, various data which is high in rewriting frequency is stored.

The I/O circuits 6 are input/output circuits each for outputting data from within the semiconductor chip CHP to devices externally coupled to the semiconductor chip CHP, and inputting data from the devices externally coupled to the semiconductor chip CHP into the semiconductor chip.

Figure 2:
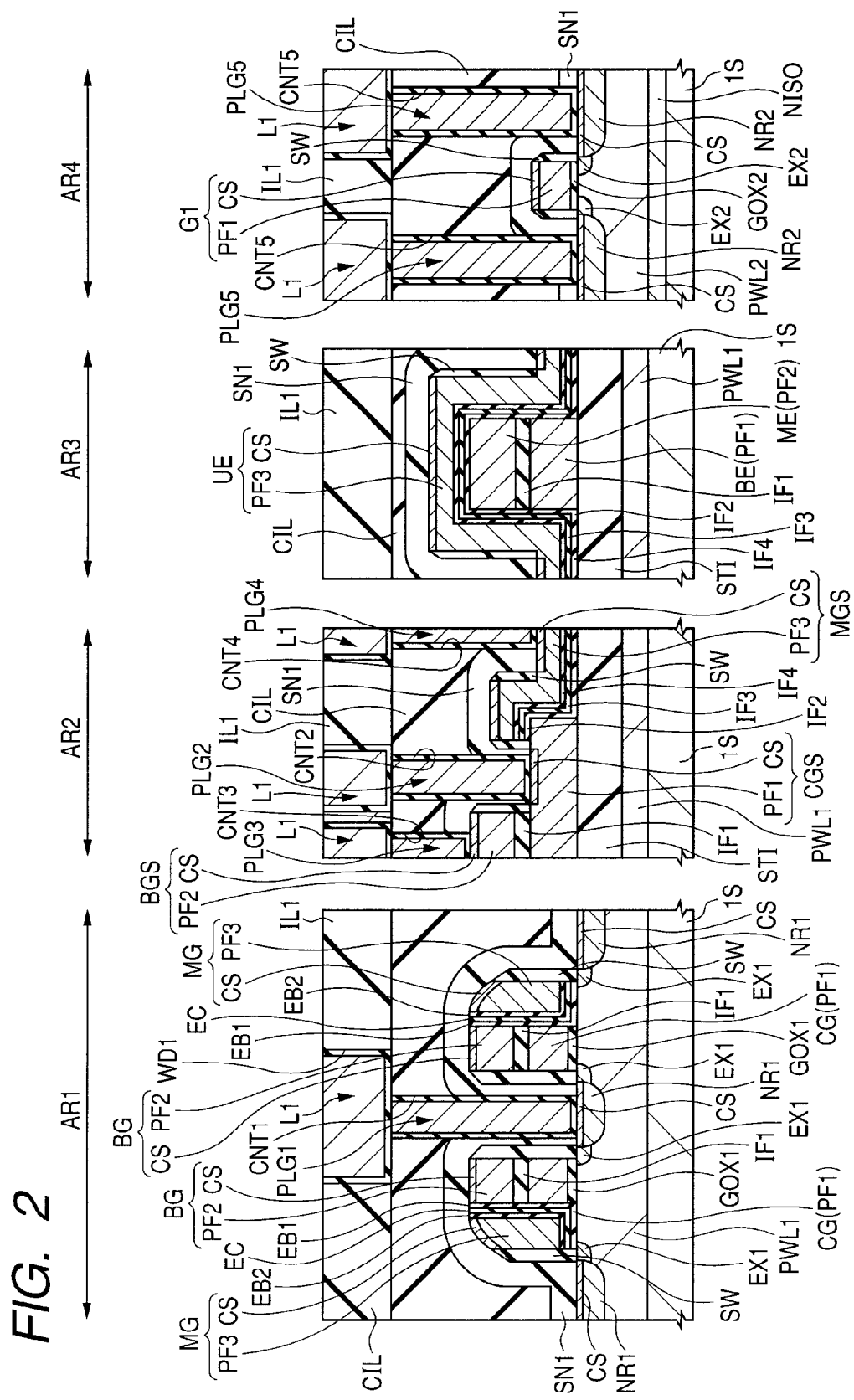
FIG. 2 is a cross-sectional view showing a structure of the semiconductor device in Embodiment 1.

Next, a description will be given of a structure of the nonvolatile memory in Embodiment 1. The nonvolatile memory in Embodiment 1 forms the EEPROM 4 or the flash memory 5 shown in FIG. 1. FIG. 2 is a view showing a cross section of the nonvolatile memory in Embodiment 1. In FIG. 2, a memory cell formation area AR1, a lead-out area AR2, a capacitive element formation area AR3, and a peripheral circuit formation area AR4 are shown. In the memory cell formation area AR1, two memory cells are shown. In the capacitive element formation area AR3, a stacked capacitor is shown. In the peripheral circuit formation area AR4, a Metal Insulator Semiconductor Field Effect Transistor (MISFET) forming a peripheral circuit is shown.

Note that, of MISFETs equivalent to the MISFET formed in the peripheral circuit formation area AR4, the CPU1, the RAM 2, the analog circuit 3, and the I/O circuit 6 are formed.

First, a description will be given of a structure of each of the memory cells formed in the memory cell formation area AR1. As shown in FIG. 2, in the memory cell formation area AR1, a p-type well PWL1 is formed over a semiconductor substrate 1S. Over the p-type well PWL1, the memory cells are formed. Each of the memory cells includes a selection portion for selecting the memory cell and a storage portion storing therein information.

First, a description will be given of a structure of the selection portion for selecting the memory cell. The memory cell has a gate insulating film GOX1 formed over the semiconductor substrate 1S (p-type well PWL1) and, over the gate insulating film GOX1, a control gate electrode (control electrode) CG is formed. Further, in the memory cell in Embodiment 1, an insulating film IF1 is formed over the control gate electrode CG and, over the insulating film IF1, a boost gate electrode BG is formed.

The gate insulating film GOX1 is formed of, e.g., a silicon dioxide film. The control gate electrode CG is formed of, e.g., a polysilicon film PF1 which is a conductive film. The insulating film IF1 is formed of, e.g., a silicon dioxide film. The boost gate electrode BG is formed of, e.g., a polysilicon film PF2 and a silicide film CS which are conductive films. The silicide film CS is formed to lower the resistance of the boost gate electrode BG, and is formed of, e.g., a cobalt silicide film or a nickel silicide film.

The control gate electrode CG described above has the function of selecting a memory cell. That is, with the control gate electrode CG, a specified memory cell is selected, and a write operation, an erase operation, or a read operation is performed to the selected memory cell.

Next, a description will be given of a structure of the memory portion of each of the memory cells. Over respective one side walls of the control gate electrode CG and the boost gate electrode BG, a memory gate electrode MG is formed via a multilayer insulating film comprised of insulating films. The memory gate electrode MG is in the shape of a sidewall formed over the respective one side walls of the control gate electrode CG and the boost gate electrode BG, and formed of a polysilicon film PF3 and a silicide film CS formed over the polysilicon film PF3. The silicide film CS is formed to lower the resistance of the memory gate electrode MG, and formed of, e.g., a cobalt silicide film or a nickel silicide film.

Between the respective one side walls of the control gate electrode CG and the boost gate electrode BG and the memory gate electrode MG and between the memory gate electrode MG and the semiconductor substrate 1S, the multilayer insulating film is formed. The multilayer insulating film includes a potential barrier film EB1 formed over the semiconductor substrate 1S, a charge accumulation film EC formed over the potential barrier film EB1, and a potential barrier film EB2 formed over the charge accumulation film EC. The potential barrier film EB1 is formed of, e.g., an insulating film such as a silicon dioxide film, and functions as a gate insulating film formed between the memory gate electrode MG and the semiconductor substrate 1S. The potential barrier film EB1 comprised of the silicon dioxide film also has the function of a tunnel insulating film. For example, the memory portion of the memory cell injects electrons or holes from the semiconductor substrate 1S into the charge accumulation film EC via the potential barrier film EB1 to perform the storage or erasing of information. Therefore, the potential barrier film EB1 functions as the tunnel insulating film.

The charge accumulation film EC formed over the potential barrier film EB1 has the function of accumulating charges therein. Specifically, in Embodiment 1, the charge accumulation film EC is formed of a silicon nitride film. The memory portion of the memory cell in Embodiment 1 stores therein information by controlling a current flowing in the semiconductor substrate 1S under the memory gate electrode MG depending on the presence or absence of charges accumulated in the charge accumulation film EC. That is, the memory portion stores therein information using the phenomenon in which the threshold voltage of the current flowing in the semiconductor substrate 1S under the memory gate electrode MG varies depending on the presence or absence of charges accumulated in the charge accumulation film EC.

In Embodiment 1, as the charge accumulation film EC, an insulating film having a trap level is used. As an example of the insulating film having the trap level, a silicon nitride film can be listed, but the insulating film having the trap level is not limited to a silicon nitride film. It is also possible that a high-dielectric-constant film having a dielectric constant higher than that of a silicon nitride film such as, e.g., an aluminum oxide (alumina) film, a hafnium dioxide film, or a tantalum oxide film may be used. The charge accumulation film EC may also be formed from a silicon nanodot. In the case of using the insulating film having the trap level as the charge accumulation film EC, charges are trapped by the trap level formed in the insulating film. By thus causing the trap level to trap charges, the charges are accumulated in the insulating film.

Conventionally, as the charge accumulation film EC, a polysilicon film has been primarily used. In the case of using a polysilicon film as the charge accumulation film EC, if there is a defect in any part of the potential barrier film FB1 or the potential barrier film EB2 surrounding the charge accumulation film EC, all the charges accumulated in the charge accumulation film EC may leak due to abnormal leakage because the charge accumulation film EC is a conductive film.

In view of the foregoing, as the charge accumulation film EC, a silicon nitride film as an insulating material has been used. In this case, charges contributing to data storage are accumulated at a discrete trap level present in the silicon nitride film. As a result, even if a defect occurs in a part of the potential barrier film EB1 or the potential barrier film EB2 surrounding the charge accumulation film EC, the charges are accumulated at the discrete trap level in the charge accumulation film EC so that there is no situation in which all the charges leak from the charge accumulation film EC. This allows an improvement in the reliability of data retention.

For this reason, by using such a film containing a discrete trap level as the charge accumulation film EC without limiting the charge accumulation film EC to a silicon nitride film, the reliability of data retention can be improved. In addition, in Embodiment 1, a silicon nitride film having an excellent data retention property is used as the charge accumulation film EC. As a result, it is possible to reduce the thickness of each of the potential barrier films EB1 and EB2 provided to prevent charges from flowing out of the charge accumulation film EC. This also has the advantage of allowing a voltage for driving the memory cell to be lowered.

On the other hand, the potential barrier film EB2 is an insulating film for ensuring insulation between the charge accumulation film EC and the memory gate electrode MG. The potential barrier film EB2 is formed of an insulating film such as, e.g., a silicon dioxide film or a silicon oxynitride film.

On one of the side walls of each of the control gate electrode CG and the boost gate electrode BG, the memory gate electrode MG is formed while, on the other side wall thereof, a sidewall SW comprised of a silicon dioxide film is formed. Likewise, on one of the side walls of the memory gate electrode MG, the control gate electrode CG and the boost gate electrode BG are formed while, on the other side wall thereof, the sidewall SW comprised of a silicon dioxide film is formed.

In the semiconductor substrate 1S located immediately under the sidewall SW, a pair of shallow low-concentration impurity diffusion regions EX1 serving as n-type semiconductor regions are formed. In the regions in contact with and outside the pair of shallow low-concentration impurity diffusion regions EX1, a pair of deep high-concentration impurity diffusion regions NR1 are formed. The deep high-concentration impurity diffusion regions NR1 are also n-type semiconductor regions. Over the surfaces of the deep high-concentration impurity diffusion regions NR1, cobalt silicide films (silicide films CS) are formed. Of the pair of shallow low-concentration impurity diffusion regions EX1 and the pair of deep high-concentration impurity diffusion regions NR1, the source region and drain region of each of the memory cells are formed. By forming the source region and drain region of the pair of shallow low-concentration impurity diffusion regions EX1 and the pair of deep high-concentration impurity diffusion regions NR1, each of the source region and the drain region can be provided with a Lightly Doped Drain (LDD) structure. Here, it is assumed that a transistor including the gate insulating film GOX1, the control gate electrode CG formed over the gate insulating film GOX1, and the source and drain regions described above is referred to as a selection transistor. On the other hand, it is assumed that a transistor including the multilayer insulating film comprised of the potential barrier film EB1, the charge accumulation film EC, and the potential barrier film EB2, the memory gate electrode MG formed over the multilayer insulating film, and the source and drain regions described above is referred to as a memory transistor. As a result, it can be said that the selection portion of the memory cell is formed from the selection transistor, and the memory portion of the memory cell is formed from the memory transistor. In this manner, the memory cell is configured.

Subsequently, a description will be given of a wiring structure coupled to each of the memory cells. Over the memory cell, a silicon nitride film SN1 and a contact interlayer insulating film CIL comprised of a silicon dioxide film are formed so as to cover the memory cell. In the contact interlayer insulating film CIL, a contact hole CNT1 extending through the contact interlayer insulating film CIL, and reaching the silicide film CS forming the source region and the drain region is formed. The silicide film CS is formed of, e.g., a cobalt silicide film or a nickel silicide film. The silicide film CS may also be formed by performing a salicide process to an epitaxial layer formed over the semiconductor substrate 1S. The epitaxial layer is formed from, e.g., silicon or silicon germanium. Hereinbelow, the silicide film CS will be described by showing cobalt silicide as an example.

In the contact hole CNT1, a titanium/titanium nitride film serving as a barrier conductive film is formed, and a tungsten film is formed so as to be buried in the contact hole CNT1. By thus burying the titanium/titanium nitride film and the tungsten film in the contact hole CNT1, a conductive plug PLG1 is formed. Over the contact interlayer insulating film CIL, an interlayer insulating film IL1 comprised of, e.g., a silicon dioxide film is formed. In the interlayer insulating film IL1, a wiring trench WD1 is formed. A line L1 is formed so as to be buried in the wiring trench WD1. The line L1 is formed of a multilayer film of, e.g., a tantalum/tantalum nitride film and a copper film, and electrically coupled to the plug PLG1 formed in the contact interlayer insulating film CIL.

Here, the memory cell in Embodiment 1 is characterized in that the boost gate electrode BG is formed over the control gate electrode CG via the insulating film IF1. The boost gate electrode BG has the function of boosting a voltage applied to the memory gate electrode MG through capacitive coupling between the boost gate electrode BG and the memory gate electrode MG. That is, during a write operation or an erase operation to the memory cell, a high voltage is applied to the memory gate electrode MG, and Embodiment 1 is characterized in that, to apply the high voltage to the memory gate electrode MG, the capacitive coupling using the boost gate electrode BG is subsidiarily used. The reason for thus using the capacitive coupling between the boost gate electrode BG and the memory gate electrode MG during an operation of boosting the voltage of the memory gate electrode MG is as follows.

For example, in a semiconductor chip formed with a nonvolatile memory, a control circuit for operating the nonvolatile memory is formed, and a voltage boosting circuit for generating a voltage having a large absolute value which is used for a write operation or an erase operation exists as a part of the control circuit. That is, by the voltage boosting circuit, the high voltage applied to the memory gate electrode MG of the memory cell is generated.

Such a voltage boosting circuit for generating a high voltage having a large absolute value needs to have structure such that a high-breakdown-voltage MISFET that can withstand a high voltage is used to increase the thickness of a gate insulating film. As a result, it is necessarily difficult to reduce the size of the high-breakdown-voltage MISFET forming the voltage boosting circuit. That is, in the high-breakdown-voltage MISFET used in the voltage boosting circuit, to ensure a sufficient breakdown voltage, the thickness of the gate insulating film needs to be increased but, when the thickness of the gate insulating film is increased, the size of the high-breakdown-voltage MISFET is increased in accordance with the scaling law. Thus, in the nonvolatile memory, a problem arises that, since the high voltage having the large absolute value is used as the operation voltage, the size of the voltage boosting circuit of which a high breakdown voltage is required cannot be reduced, and consequently the size of the semiconductor chip formed with the nonvolatile memory cannot be reduced sufficiently.

Therefore, in Embodiment 1, the high voltage applied to the memory gate electrode MG is generated not only using the voltage boosting circuit, but also subsidiarily using the capacitive coupling. A case is considered where, e.g., a high voltage of 11.2 V is applied to the memory gate electrode MG. At this time, when a high voltage of 11.2 V is generated using only the voltage boosting circuit, it is necessary to use a high-breakdown-voltage MISFET that can withstand at least the high voltage of 11.2 V as the MISFET forming the voltage boosting circuit. Instead, by generating 8 V of the high voltage (11.2 V) applied to the memory gate electrode MG using the voltage boosting circuit, and boosting the 8 V voltage to 11.2 V through the capacitive coupling, the breakdown voltage of the MISFET forming the voltage boosting circuit can be lowered to a level of 8 V. This means that the thickness of the gate insulating film of the high-breakdown-voltage MISFET forming the voltage boosting circuit can be reduced, and consequently the size of the high-breakdown-voltage MISFET forming the voltage boosting circuit can be reduced. That is, instead of generating the high voltage applied to the memory gate electrode MG using only the voltage boosting circuit, by subsidiarily using the capacitive coupling, it is possible to reduce the size of the high-breakdown-voltage MISFET forming the voltage boosting circuit. As a result, it is possible to reduce the size of the voltage boosting circuit, and obtain a remarkable effect of sufficiently reducing the size of the semiconductor chip formed with the nonvolatile memory.

The voltage boosting through the capacitive coupling described above can be shown by the relationship shown below. That is, the capacitive coupling is given by the relational expression: Potential of Boosted Voltage of Memory Gate Electrode MG=(Capacitive Coupling Ratio of Memory Gate Electrode MG to Boost Gate Electrode BG)×(Potential Change in Boost Gate Electrode BG). From the relational expression, it can be seen that, because the capacitive coupling ratio of the memory gate electrode MG to the boost gate electrode BG is necessary, a capacitive element needs to be formed of the memory gate electrode MG and the boost gate electrode BG. Therefore, in Embodiment 1, as shown in FIG. 2, the boost gate electrode BG is formed over the control gate electrode CG via the insulating film IF1, and the memory gate electrode MG is formed over the side wall of the boost gate electrode BG via the multilayer insulating film. At this time, by forming the memory gate electrode MG over the respective side walls of the control gate electrode CG and the boost gate electrode BG, and setting the height of the control gate electrode CG lower than the height of the memory gate electrode MG, the capacitive element for implementing the capacitive coupling can be formed between the boost gate electrode and the memory gate electrode. That is, of the boost gate electrode BG, the memory gate electrode. MG, and the multilayer insulating film interposed between the boost gate electrode BG and the memory gate electrode MG, the capacitive element is formed.

Figure 3:
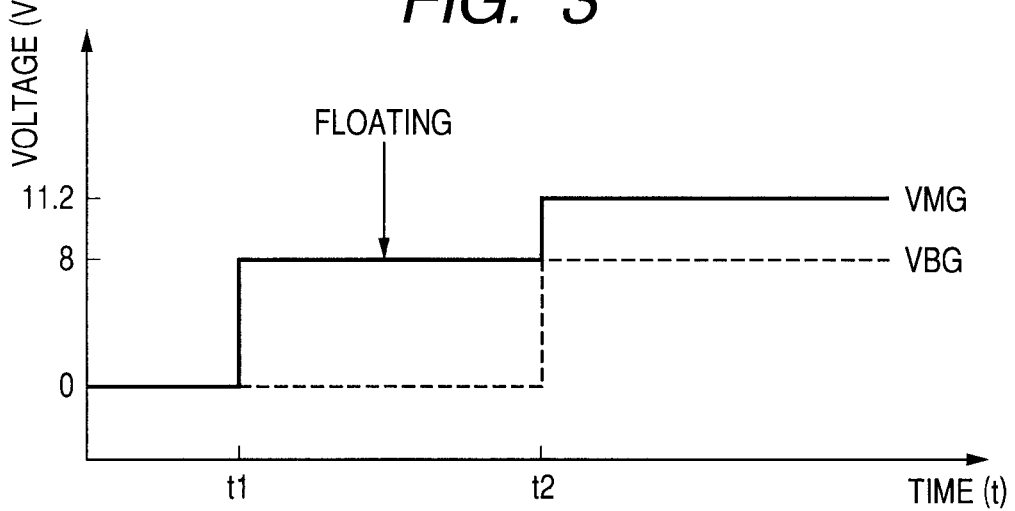
FIG. 3 is a timing chart for illustrating a voltage boosting operation through capacitive coupling.

Referring to the drawing, a description will be given of the operation of the capacitive coupling using the boost gate electrode BG in the memory cell thus configured. FIG. 3 is a timing chart for illustrating a voltage boosting operation using the capacitive coupling. In FIG. 3, the abscissa axis shows a time, and an ordinate axis shows a voltage. First, as shown in FIG. 3, before a time t1, 0 V is applied to each of the boost gate electrode BG and the memory gate electrode MG. At this time, the solid line of FIG. 3 indicates a voltage VMG applied to the memory gate electrode MG, and the broken line of FIG. 3 indicates a voltage VBG applied to the boost gate electrode BG.

Subsequently, at a time t1, 8 V is applied to the memory gate electrode MG. At this time, 0 V is still applied to the boost gate electrode BG. Then, after the time t1, the memory gate electrode MG is brought into a floating state. Then, at a time t2, 8 V is applied to the boost gate electrode BG. That is, at the time t2, the voltage of the boost gate electrode BG changes from 0 V to 8 V. As a result, the voltage of the memory gate electrode MG in the floating state rises to, e.g., 11.2 V through the capacitive coupling. In this manner, the voltage applied to the memory gate electrode MG can be boosted through the capacitive coupling. That is, even when the voltage applied by the voltage boosting circuit to the memory gate electrode MG is 8 V, by using the capacitive coupling described above, the voltage applied to the memory gate electrode MG can be boosted to 11.2 V.

Figure 4:
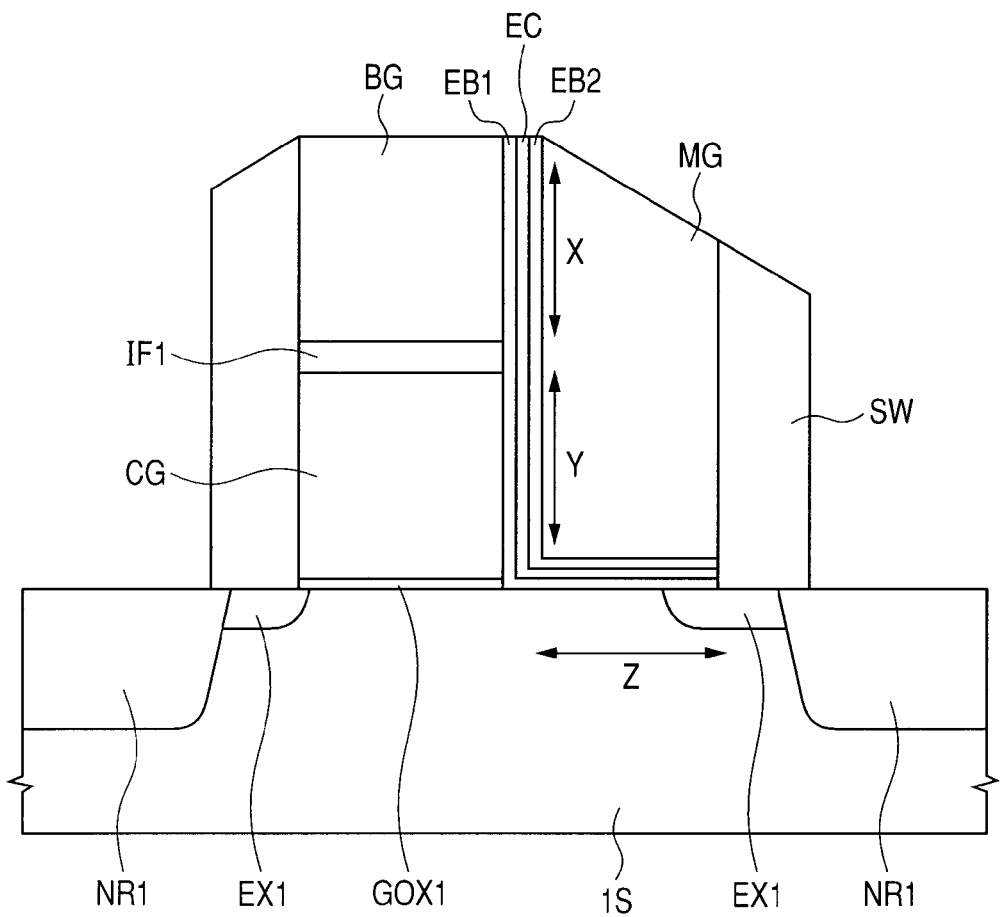
FIG. 4 is a view showing a structure of a memory cell in Embodiment 1.

Next, referring to the drawing, a description will be given of the result of examining a level to which the voltage outputted from the voltage boosting circuit can be lowered using specific numerical values. FIG. 4 is a view showing a structure of the memory cell in Embodiment 1. In FIG. 4, it is assumed that the height of the boost gate electrode BG is X, the height of the control gate electrode CG is Y, and the gate length (lateral width) of the memory gate electrode MG is Z. When the voltage VMG is applied to the memory gate electrode MG, the memory gate electrode MG is subsequently brought into the floating state, and then the voltage VBG is applied to the boost gate electrode BG, it follows that a voltage given by Voltage VMG+Voltage VBG×X/(X+Y+Z) is applied between the memory gate electrode MG and the semiconductor substrate 1S. Here, X/(X+Y+Z) indicates the capacitive coupling ratio of the memory gate electrode MG to the boost gate electrode BG. That is, besides the capacitive element formed between the memory gate electrode MG and the boost gate electrode BG, capacitive elements are also formed between the memory gate electrode MG and the control gate electrode CG and between the memory gate electrode MG and the semiconductor substrate 1S. The ratio of the capacitive element formed between the memory gate electrode MG and the boost gate electrode BG to all these capacitive elements is represented by X/(X+Y+Z), and it follows that X/(X+Y+Z) indicates the capacitive coupling ratio of the memory gate electrode MG to the boost gate electrode BG.

When it is assumed that X=100 nm, Y=100 nm, and Z=50 nm, the voltage applied by the capacitive coupling to the memory gate electrode MG is expressed as Voltage VBG×X/(X+Y+Z)=Voltage VBG×0.4. When it is assumed that Voltage VMG=Voltage VBG is further satisfied, the voltage applied to the memory gate electrode MG becomes 1.4× VMG~1.5×VMG. Accordingly, the output voltage from the voltage boosting circuit when the capacitive coupling is used can be reduced to a level of about ⅔ of the output voltage from the voltage boosting circuit when the capacitive coupling is not used. This allows, according to Embodiment 1, the voltage boosting circuit to be reduced in size, and therefore allows the remarkable effect of sufficiently reducing the size of the semiconductor chip formed with the nonvolatile memory to be obtained. That is, in Embodiment 1, it is effective to form the control gate electrode CG and the boost gate electrode BG such that the respective thicknesses (Y) and (X) thereof are each larger than the gate length (Z) of the memory gate electrode MG. In other words, it is desired to satisfy X, Y>Z.

Thus, since the high voltage is applied to the boost gate electrode BG, sufficient dielectric strength is required of the insulating film IF1 formed between the boost gate electrode BG and the control gate electrode CG. Accordingly, the thickness of the insulating film IF1 needs to be, e.g., set larger than the thickness of the gate insulating film GOX1. That is, the gate insulating film GOX1 is formed between the semiconductor substrate 1S and the control gate electrode CG, but a voltage of only about 1.5 V is applied to the control gate electrode CG. By contrast, to the boost gate electrode BG, a voltage of, e.g., about 8 V is applied so that the dielectric strength required of the insulating film IF1 is higher than dielectric strength required of the gate insulating film GOX1. Therefore, the thickness of the insulating film IF1 needs to be set larger than the thickness of the gate insulating film GOX1.

In addition, the thickness of the insulating film IF1 is set equal to or larger than the thickness of the multilayer insulating film formed between the boost gate electrode BG and the memory gate electrode MG. Note that the insulating film IF1 is formed of an insulating film such as, e.g., a silicon dioxide film, but may also be formed of a multilayer insulating film of a silicon dioxide film, a silicon nitride film, and a silicon dioxide film, similarly to the multilayer insulating film.

If the thickness (X) of the boost gate electrode BG is excessively large, a level difference in each of the memory cells increases, and etching control when the contact hole coupled to the source region, the drain region, and each of the gate electrodes may be difficult. Hereinbelow, a description will be given with reference to the contact hole CNT1 in the memory cell formation area AR1 and contact holes CNT2, CNT3, and CNT4 in the lead-out area AR2 each shown in FIG. 2. The contact holes CNT1 to CNT4 are simultaneously formed and, even after the contact hole CNT3 reaches the lead-out electrode BGS (lead-out electrode of the boost gate electrode BG), etching needs to be continued during the formation of the contact holes CNT1, CNT2, and CNT4. At this time, to provide withstandability against long etching, it is also necessary to increase the height of a resist pattern. As a result, an aspect ratio becomes stringent so that etching for the contact hole CNT1 becomes particularly difficult. Therefore, the depth of the contact hole CNT3 needs to be as close as possible to the depths of the contact holes CNT1, CNT2, and CNT4. Accordingly, it is desired that the boost gate electrode BG is formed as thin as possible. That is, it is desired that the thickness (X) of the boost gate electrode BG is equal to or smaller than the thickness (Y) of the control gate electrode CG. Hence, it is desired to satisfy the relation given by X, Y>Z and the relation given by Y=X.

In Embodiment 1, as shown in FIG. 2, the boost gate electrode BG is formed over the control gate electrode CG. Therefore, it is necessary to improve a structure of the lead-out electrode for applying a voltage to the control gate electrode CG. Hereinbelow, a description will be given of the structure of the lead-out electrode in each of the control gate electrode CG, the boost gate electrode BG, and the memory gate electrode MG of the memory cell.

In FIG. 2, the lead-out area AR2 is shown. A structure of the lead-out area AR2 will be described. In the lead-out area AR2, the p-type well PWL1 is formed over the semiconductor substrate 1S. Over the p-type well PWL1, an isolation region STI is formed. Over the isolation region STI, a lead-out electrode CGS is formed. The lead-out electrode CGS is formed of the same film (polysilicon film PF1) as that of the control gate electrode CG of the memory cell. The control gate electrode CG extends to lie over the isolation region STI, and serve as the lead-out electrode CGS. Over the lead-out electrode CGS, a lead-out electrode BGS is formed via the insulating film IF1. The insulating film IF1 and the lead-out electrode BGS are formed so as not to completely cover the lead-out electrode CGS, but to expose an end portion of the lead-out electrode CGS. That is, the insulating film IF1 and the lead-out electrode BGS are not formed over the end portion of the lead-out electrode CGS so that a stepped configuration is formed. The lead-out electrode BGS is formed of the same films (the polysilicon film PF2 and the cobalt silicide film (silicide film CS)) as those of the boost gate electrode BG of the memory cell. The boost gate electrode BG extends to lie over the isolation region ST1, and serve as the lead-out electrode BGS. Further, a multilayer insulating film is formed so as to rise from over the isolation region ST1, and rest on the end portion of the lead-out electrode CGS and, over the multilayer insulating film, a lead-out electrode MGS is formed. At this time, the multilayer insulating film is formed of a multilayer film of insulating films IF2, IF3, and IF4. The insulating film IF2 serves as the potential barrier film EB1 of the memory cell, while the insulating film IF3 serves as the charge accumulation film EC of the memory cell. The insulating film IF4 serves as the potential barrier film EB2 of the memory cell. The lead-out electrode MGS is formed of the same films (the polysilicon film PF3 and the cobalt silicide film (silicide film CS)) as those of the memory gate electrode MG of the memory cell. The memory gate electrode MG extends to lie over the isolation region STI, and serve as the lead-out electrode MGS.

Over the respective side walls of the lead-out electrodes BGS and MGS thus configured, the sidewalls SW are formed.

Additionally, in the lead-out area AR2, the silicon nitride film SN1 and the contact interlayer insulating film CIL comprised of the silicon dioxide film are formed so as to cover the lead-out electrodes CGS, BGS, and MGS. In the contact interlayer insulating film CIL, the contact hole CNT2 first extending through the contact interlayer insulating film CIL to be coupled to the end portion of the lead-out electrode CGS is formed. In the contact hole CNT2, the titanium/titanium nitride film serving as the barrier conductive film is formed, and the tungsten film is formed so as to be buried in the contact hole CNT2. By thus burying the titanium/titanium nitride film and the tungsten film in the contact hole CNT2, a conductive plug PLG2 is formed. That is, the lead-out electrode CGS is electrically coupled to the plug PLG2. At this time, the cobalt silicide film (silicide film CS) is formed in the end portion of the lead-out electrode CGS, and the plug PLG2 is coupled onto the cobalt silicide film (silicide film CS). That is, in Embodiment 1, the boost gate electrode BG is formed over the control gate electrode CG in the memory cell so that the cobalt silicide film (silicide film CS) is not formed over the surface of the control gate electrode CG. By contrast, in the lead-out area AR2, the lead-out electrode BGS is not formed over the end portion of the lead-out electrode CGS electrically coupled to the control gate electrode CG, and therefore the cobalt silicide film (silicide film CS) can be formed in the end portion of the lead-out electrode CGS. As a result, the contact resistance between the lead-out electrode CGS and the plug PLG2 can be reduced.

Also in the contact interlayer insulating film CIL, the contact hole CNT3 extending through the contact interlayer insulating film CIL to be coupled to the lead-out electrode BGS is formed. In the contact hole CNT3, the titanium/titanium nitride film serving as the barrier conductive film is formed, and the tungsten film is formed so as to be buried in the contact hole CNT3. By thus burying the titanium/titanium nitride film and the tungsten film in the contact hole CNT3, a conductive plug PLG3 is formed. That is, the lead-out electrode BGS is electrically coupled to the plug PLG3.

Also in the contact interlayer insulating film CIL, the contact hole CNT4 extending through the contact interlayer insulating film CIL to be coupled to the lead-out electrode MGS is formed. In the contact hole CNT4, the titanium/titanium nitride film serving as the barrier conductive film is formed, and the tungsten film is formed so as to be buried in the contact hole CNT4. By thus burying the titanium/titanium nitride film and the tungsten film in the contact hole CNT4, a conductive plug PLG4 is formed. That is, the lead-out electrode MGS is electrically coupled to the plug PLG4.

Over the contact interlayer insulating film CIL, the interlayer insulating film IL1 comprised of, e.g., a silicon dioxide film is formed and, in the interlayer insulating film IL1, wiring trenches are formed. The lines L1 are formed so as to be buried in the wiring trenches. Each of the lines L1 is formed of, e.g., a multilayer film of a tantalum/tantalum nitride film and a copper film, and electrically coupled to the plugs PLG2 to PLG4 formed in the contact interlayer insulating film CIL.

Thus, in Embodiment 1, the control gate electrode CG is coupled to the plug PLG2 via the lead-out electrode CGS, and a voltage can be supplied from the line L1 over the plug PLG2 to the control gate electrode CG. Likewise, the boost gate electrode BG is coupled to the plug PLG3 via the lead-out electrode BGS, and a voltage can be supplied from the line L1 over the plug PLG3 to the boost gate electrode BG. The memory gate electrode MG is coupled to the plug PLG4 via the lead-out electrode MGS, and a voltage can be supplied from the line L1 over the plug PLG4 to the memory gate electrode MG.

Figure 5:
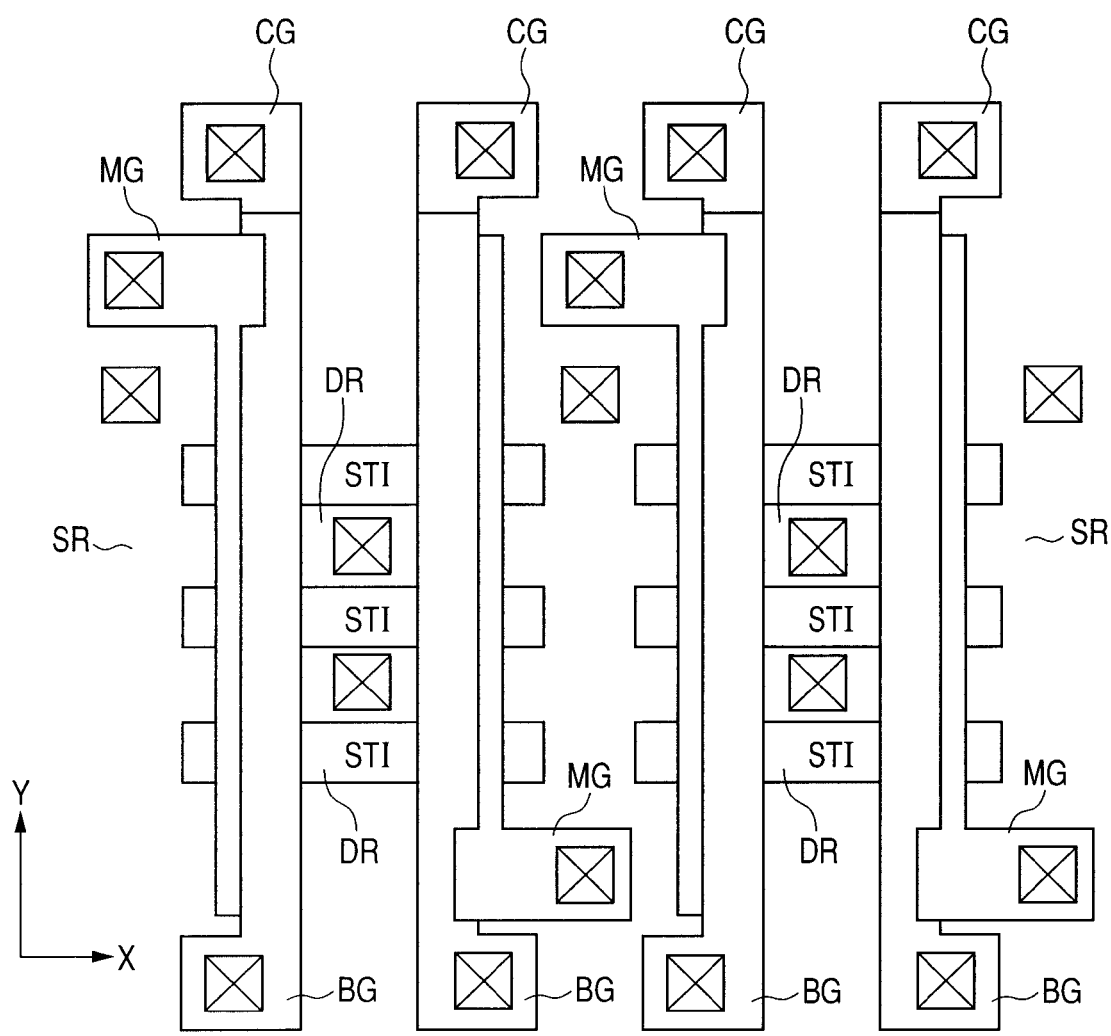
FIG. 5 is a plan view showing a layout configuration of a nonvolatile memory including a plurality of memory cell formation areas and a plurality of lead-out areas.

Subsequently, a description will be given of another example of the structure of the lead-out electrode in each of the control gate electrode CG, the boost gate electrode BG, and the memory gate electrode MG of the memory cell with reference to FIG. 5. FIG. 5 is a plan view showing a layout configuration of a nonvolatile memory including a plurality of memory cell formation areas and a plurality of lead-out areas. In FIG. 5, for example, six isolation regions STI are formed over a semiconductor substrate, and four control gate electrodes CG and four boost gate electrode BG each extending over the isolation regions STI in the Y-direction are formed. At this time, the boost gate electrodes BG are formed over the control gate electrodes CG. Over the respective side walls of the control gate electrodes CG and the boost gate electrodes BG, the memory gate electrodes MG are formed to extend also in the Y-direction. Further, in the semiconductor substrate, source regions SR and drain regions DR are formed.

In the nonvolatile memory thus configured, plugs are coupled to the control gate electrodes CG in the upper end portion of FIG. 5. That is, in the upper end portion of FIG. 5, the boost gate electrodes over the control gate electrodes CG are removed so that the control gate electrodes CG are exposed. This allows the control gate electrodes CG to be coupled to the plugs. On the other hand, in the lower end portion of FIG. 5, the boost gate electrodes BG are formed over the control gate electrodes CG, and plugs are coupled to the boost gate electrodes BG. Further, at the end portions of the memory gate electrodes MG, plugs are coupled to the memory gate electrodes MG. The source regions SR and the drain regions DR are also coupled to plugs. From the description given above, it will be understood that, in this example also, a voltage can be applied to each of the control gate electrodes CG, the boost gate electrode BG, and the memory gate electrodes MG of the memory cells.

Next, a description will be given of a structure of the stacked capacitive element formed in the capacitive element formation area AR3 with reference to FIG. 2. In the capacitive element formation area AR3 of FIG. 2, over the semiconductor substrate 1S, the p-type well PWL1 is formed and, over the p-type well PWL1, the isolation region STI is formed. Over the isolation region ST1, a base electrode BE is formed. The base electrode BE is formed of the polysilicon film PF1. It follows therefore that the base electrode BE is formed of the same film as that of the control gate electrode CG formed in the memory cell formation area AR1. Over the base electrode BE, the insulating film IF1 is formed and, over the insulating film IF1, a middle electrode ME is formed. The middle electrode ME is formed of the polysilicon film PF2. It follows therefore that the middle electrode ME is formed of the same film as that of the boost gate electrode BG formed in the memory cell formation area AR1. Of the base electrode BE, the insulating film IF1 serving as a capacitor insulating film, and the middle electrode ME that are thus configured, a first capacitive element is formed.

Further, over the isolation region STI covering the middle electrode ME, a multilayer insulating film is formed and, over the multilayer insulating film, an upper electrode UE is formed. The upper electrode UE is formed of the polysilicon film PF3 and the cobalt silicide film (silicide film CS). It follows therefore that the upper electrode UE is formed of the same film as that of the memory gate electrode MG formed in the memory cell formation area AR1. Note that, over the side walls of the upper electrode UE, the sidewalls SW are formed. The multilayer insulating film includes the insulating films IF2, IF3, and IF4. The insulating film IF2 serves as the potential barrier film EB1 of the memory cell, while the insulating film IF3 serves as the charge accumulation film EC of the memory cell. The insulating film IF4 serves as the potential barrier film EB2 of the memory cell.

Of the middle electrode ME, the multilayer insulating film serving as the capacitor insulating film, and the upper electrode UE that are thus configured, a second capacitive element is formed. As a result, in the capacitive element formation area AR3, the stacked capacitive element comprised of the first capacitive element and the second capacitive element is formed.

In Embodiment 1, in the memory cell in the memory cell formation area AR1, the boost gate electrode BG is formed. Accordingly, the polysilicon film PF1 forming the control gate electrode CG, the polysilicon film PF2 forming the boost gate electrode BG, and the polysilicon film PF3 forming the memory gate electrode MG are needed. Therefore, in the capacitive element formation area AR3 also, using these polysilicon films PF1 to PF3, the stacked capacitive element can be formed. That is, in the case where the boost gate electrode BG is not formed, the polysilicon film PF2 is not needed so that, for the capacitive element, only the polysilicon film PF1 forming the control gate electrode CG and the polysilicon film PF3 forming the memory gate electrode MG are used. At this time, the capacitive element formed in the capacitive element formation area AR3 is a single-layered capacitive element comprised of the base electrode BE in the same layer as that of the control gate electrode CG, the multilayer insulating film, and the upper electrode UE in the same layer as that of the memory gate electrode MG.

By contrast, in the case where the boost gate electrode BG is formed, the polysilicon film PF1 forming the control gate electrode CG, the polysilicon film PF2 forming the boost gate electrode BG, and the polysilicon film PF3 forming the memory gate electrode MG are needed. Therefore, for the capacitive element, not only the polysilicon film PF1 forming the control gate electrode CG and the polysilicon film PF3 forming the memory gate electrode MG, but also the polysilicon film PF2 forming the boost gate electrode BG can be used. At this time, the capacitive elements formed in the capacitive element formation area AR3 are the first capacitive element comprised of the base electrode BE in the same layer as that of the control gate electrode CG, the insulating film IF1, and the middle electrode ME in the same layer as that of the boost gate electrode BG and the second capacitive element comprised of the middle electrode ME, the multilayer insulating film, and the upper electrode UE in the same layer as that of the memory gate electrode MG. Thus, in Embodiment 1, using the formation of the boost gate electrode BG in the memory cell formation area AR1, the stacked capacitive element can be formed in the capacitive element formation area AR3.

Next, a description will be given of a structure of the lead-out electrode in each of the electrodes of the stacked capacitive element formed in the capacitive element formation area AR3 with reference to FIGS. 6 to 8.

Figure 6:
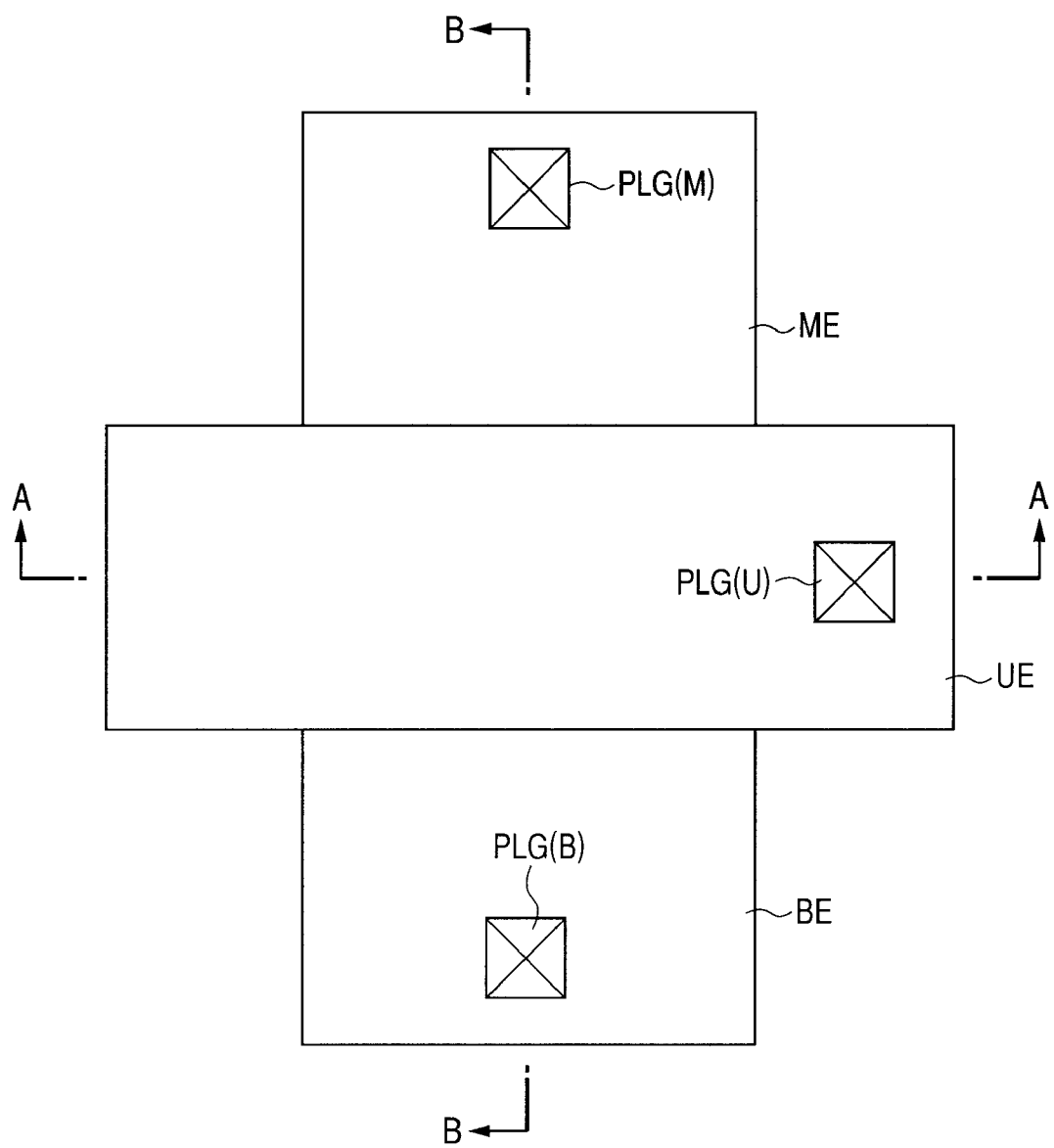
FIG. 6 is a plan view when a stacked capacitive element is viewed from thereover.

FIG. 6 is a plan view when the stacked capacitive element is viewed from thereover. As shown in FIG. 6, over the semiconductor substrate, the base electrode BE, the middle electrode ME, and the upper electrode UE each having a rectangular shape are formed. At this time, to the base electrode BE, a plug PLG(B) is coupled and, to the middle electrode ME, a plug PLG(M) is coupled. To the upper electrode UE, a plug PLG(U) is coupled.

Figure 7:
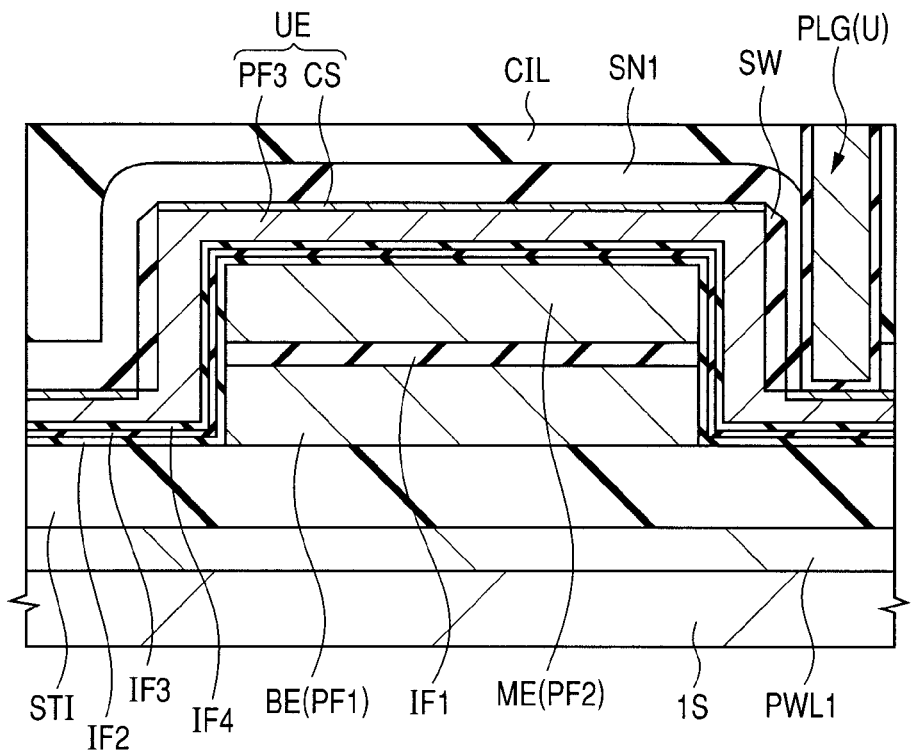
FIG. 7 is a cross-sectional view obtained by cutting the stacked capacitive element of FIG. 6 along the line A-A.

FIG. 7 is a cross-sectional view obtained by cutting the stacked capacitive element of FIG. 6 along the line A-A. In FIG. 7, over the semiconductor substrate 1S, the p-type well PWL1 is formed and, over the p-type well PWL1, the isolation region STI is formed. Over the isolation region STI, the base electrode BE is formed. The base electrode BE is formed of the polysilicon film PF1. Over the base electrode BE, the insulating film IF1 is formed and, over the insulating film IF1, the middle electrode ME is formed. The middle electrode ME is formed of the polysilicon film PF2.

Further, over the isolation region SI covering the middle electrode ME, a multilayer insulating film is formed and, over the multilayer insulating film, the upper electrode UE is formed. The upper electrode UE is formed of the polysilicon film PF3 and the cobalt silicide film (silicide film CS). Note that, over the side walls of the upper electrode UE, the sidewalls SW are formed. The multilayer insulating film includes the insulating films IF2, IF3, and IF4.

In addition, the silicon nitride film SN1 and the contact interlayer insulating film CIL comprised of the silicon dioxide film are formed so as to cover the upper electrode UE. In the contact interlayer insulating film CIL, a contact hole first extending through the contact interlayer insulating film CIL to be coupled to the upper electrode UE (lead-out area) formed over the isolation region STI is formed. In the contact hole, the titanium/titanium nitride film serving as the barrier conductive film is formed, and the tungsten film is formed so as to be buried in the contact hole. By thus burying the titanium/titanium nitride film and the tungsten film in the contact hole, a conductive plug PLG(U) is formed. That is, the upper electrode UE (lead-out area) is electrically coupled to the plug PLG(U). At this time, in the upper electrode UE (lead-out area), the cobalt silicide film (silicide film CS) is formed, and the plug PLG(U) is coupled onto the cobalt silicide film (silicide film CS).

Figure 8:
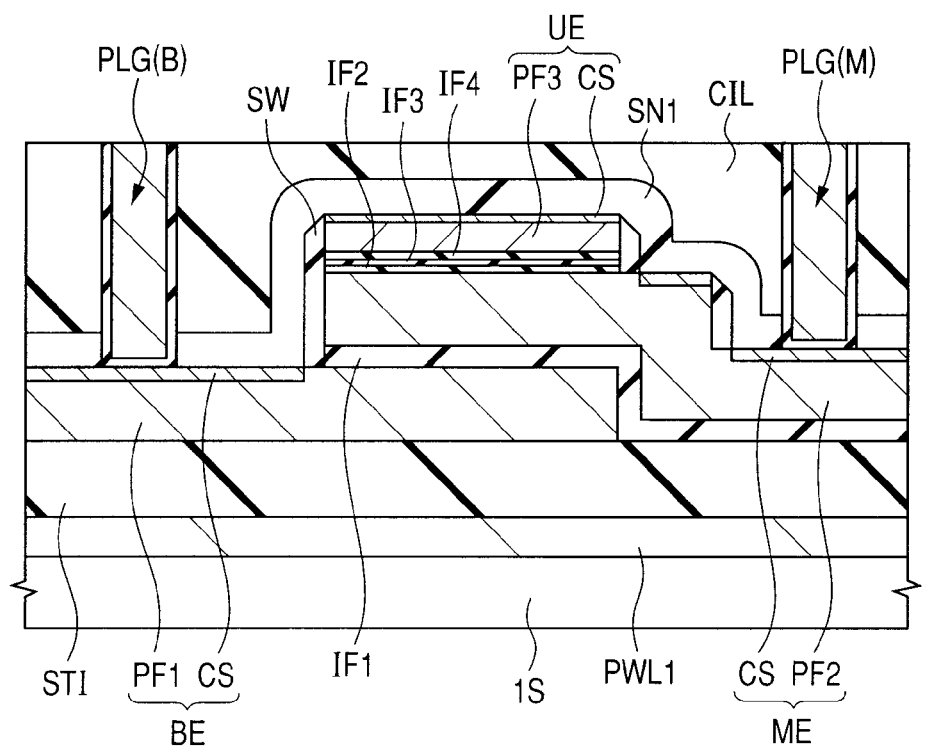
FIG. 8 is a cross-sectional view obtained by cutting the stacked capacitive element of FIG. 6 along the line B-B.

Subsequently, FIG. 8 is a cross-sectional view obtained by cutting the stacked capacitive element of FIG. 6 along the line B-B. In FIG. 8, over the semiconductor substrate 1S, the p-type well PWL1 is formed and, over the P-type well PWL1, the isolation region STI is formed. Over the isolation region STI, the base electrode BE is formed. The base electrode BE is formed of the polysilicon film PF1.

Additionally, the insulating film IF1 is formed so as to rise and rest on the end portion of the base electrode BE and, over the insulating film IF1, the middle electrode ME is formed. The middle electrode ME is formed of the polysilicon film PF2.

Over the middle electrode ME resting on the base electrode BE, a multilayer insulating film is formed and, over the multilayer insulating film, the upper electrode UE is formed. The upper electrode UE is formed of the polysilicon film PF3 and the cobalt silicide film (silicide film CS). Note that, over the respective side walls of the upper electrode UE and the middle electrode ME, the sidewalls SW are formed. The multilayer insulating film includes the insulating films IF2, IF3, and IF4.

The silicon nitride film SN1 and the contact interlayer insulating film CIL comprised of the silicon dioxide film are formed so as to cover the upper electrode UE, the middle electrode ME, and the base electrode BE. In the contact interlayer insulating film CIL, a contact hole first extending through the contact interlayer insulating film CIL to be coupled to the base electrode BE (lead-out area) formed over the isolation region STI is formed. In the contact hole, the titanium/titanium nitride film serving as the barrier conductive film is formed, and the tungsten film is formed so as to be buried in the contact hole. By thus burying the titanium/titanium nitride film and the tungsten film in the contact hole, a conductive plug PLG(B) is formed. That is, the base electrode BE (lead-out area) is electrically coupled to the plug PLG(B). At this time, the cobalt silicide film (silicide film CS) is formed in the base electrode BE (lead-out area), and the plug PLG(B) is coupled onto the cobalt silicide film (silicide film CS).

Also in the contact interlayer insulating film CIL, a contact hole extending through the contact interlayer insulating film CIL to be coupled to the middle electrode ME (lead-out area) formed over the isolation region STI is formed. In the contact hole, the titanium/titanium nitride film serving as the barrier conductive film is formed, and the tungsten film is formed so as to be buried in the contact hole. By thus burying the titanium/titanium nitride film and the tungsten film in the contact hole, a conductive plug PLG(M) is formed. That is, the middle electrode ME (lead-out area) is electrically coupled to the plug PLG(M). At this time, the cobalt silicide film (silicide film CS) is formed in the middle electrode ME (lead-out area), and the plug PLG(M) is coupled onto the cobalt silicide film (silicide film CS).

It will be understood that, in this manner, a voltage can be applied to each of the base electrode BE, the middle electrode ME, and the upper electrode UE of the stacked capacitive element.

Next, a description will be given of a structure of each of MISFETs formed in the peripheral circuit formation area AR4 with reference to FIG. 2. The peripheral circuit formation area AR4 indicates an area where peripheral circuits are formed. Specifically, the nonvolatile memory (nonvolatile semiconductor memory device) includes the memory cell formation area AR1 in which the memory cells are formed as an array (in rows and columns), and the peripheral circuit formation area AR4 where the peripheral circuits for controlling the memory cells formed in the memory cell formation area AR1 are formed. The peripheral circuits formed in the peripheral circuit formation area AR4 include a word driver for controlling a voltage applied to the control gate electrode CG of each of the memory cells or the like, a sense amplifier for amplifying an output from each of the memory cells, a control circuit (including the voltage boosting circuit) for controlling the word driver and the sense amplifier, and the like. Accordingly, in the peripheral circuit formation area AR4 shown in FIG. 2, a MISFET forming, e.g., the word driver, the sense amplifier, the control circuit (including the voltage boosting circuit), or the like shown. Hereinbelow, a description will be given of an n-channel MISFET forming the peripheral circuit.

As shown in FIG. 2, in the peripheral circuit formation area AR4, a well isolation layer NISO (n-type semiconductor region) is formed over the semiconductor substrate 1S. Over the well isolation layer NISO, a p-type well PWL2 is formed. The p-type well PWL2 is formed of a p-type semiconductor region obtained by introducing a p-type impurity such as boron (B) into the semiconductor substrate 1S.

Over the p-type well PWL2 (semiconductor substrate 1S), a gate insulating film GOX2 is formed and, over the gate insulating film GOX2, a gate electrode G1 is formed. The gate insulating film GOX2 is formed of, e.g., a silicon dioxide film. The gate electrode G1 is formed of, e.g., the polysilicon film PF1 and the cobalt silicide film (silicide film CS) formed over the surface of the polysilicon film PF1. In the polysilicon film PF1 forming the gate electrode G1, to inhibit the depletion of the gate electrode G1, an n-type impurity such as, e.g., phosphorus has been introduced. The cobalt silicide film (silicide film CS) forming a part of the gate electrode G1 is formed to lower the resistance of the gate electrode G1.

Over the both side walls of the gate electrode G1, the sidewalls SW each comprised of, e.g., a silicon dioxide film are formed. In the semiconductor substrate 1S (p-type well PWL2) located immediately under the sidewalls SW, shallow low-concentration impurity diffusion regions EX2 are formed. The shallow low-concentration impurity diffusion regions EX2 are n-type semiconductor regions, and formed in alignment with the gate electrode G1. Outside the shallow low-concentration impurity diffusion regions EX2, deep high-concentration impurity diffusion regions NR2 are formed. The deep high-concentration impurity diffusion regions NR2 are also n-type semiconductor regions, and formed in alignment with the sidewalls SW. Over the surfaces of the deep high-concentration impurity diffusion regions NR2, cobalt silicide films (silicide films CS) for lowering resistance are formed. Of the shallow low-concentration impurity diffusion region EX2 and the deep high-concentration impurity diffusion region NR2, a source region is formed. Of the shallow low-concentration impurity diffusion region EX2 and the deep high-concentration impurity diffusion region NR2, a drain region is formed. Thus, in the peripheral circuit area AR4, the n-channel MISFET is formed.

Note that, in the peripheral circuit formation area AR4, a p-channel MISFET is also formed. A structure of the p-channel MISFET is obtained by inverting the conductivity types of the semiconductor regions forming the n-channel MISFET.

Subsequently, a description will be given of a wiring structure coupled to the MISFETs formed in the peripheral circuit formation area AR4. Over each of the MISFETs, the silicon nitride film SN1 and the contact interlayer insulating film CIL comprised of the silicon dioxide film are formed so as to cover the MISFET. In the contact interlayer insulating film CIL1, contact holes CNT5 extending through the contact interlayer insulating film CIL, and reaching the cobalt silicide films (silicide films CS) forming the source region and the drain region are formed. In each of the contact holes CNT5, the titanium/titanium nitride film serving as the barrier conductive film is formed, and the tungsten film is formed so as to be buried in the contact holes CNT5. By thus burying the titanium/titanium nitride film and the tungsten film in each of the contact holes CNT5, conductive plugs PLG5 are formed. Over the contact interlayer insulating film CIL, the interlayer insulating film IL1 comprised of, e.g., a silicon dioxide film is formed. In the interlayer insulating film IL1, wiring trenches are formed. The lines L1 are formed so as to be buried in the wiring trenches. The lines L1 are each formed of, e.g., a multilayer film of a tantalum/tantalum nitride film and a copper film, and electrically coupled to the plugs PLG5 formed in the contact interlayer insulating film CIL.

The gate electrode G1 of each of the MISFETs thus formed in the peripheral circuit formation area AR4 is formed of the same polysilicon film PF1 as that of the control gate electrode CG of each of the memory cells formed in the memory cell formation area AR1. That is, the gate electrode G1 of the MISFET and the control gate electrode CG are formed in the same layer. Accordingly, the height of the gate electrode G1 of the MISFET is the same as the height of the control gate electrode CG.

Here, in Embodiment 1, to use the capacitive coupling, the boost gate electrode BG is formed over the control gate electrode CG. However, by forming the boost gate electrode BG, another effect is achieved. A description will be given of the effect.

As will be described in detail in the description of a manufacturing method given later, in the case where, e.g., the boost gate electrode BG is not formed, the memory gate electrode MG of the memory cell is formed over the side wall of the control gate electrode CG. At this time, the height of the control gate electrode CG is the same as the height of the gate electrode G1 of the MISFET formed in the peripheral circuit formation area AR4. In recent years, the miniaturization of a MISFET has advanced, and the height of the gate electrode G1 of the MISFET has also lowered. Accordingly, the height of the control gate electrode CG of the memory cell formed in the same layer as that of the gate electrode G1 of the MISFET also lowers. In this case, it becomes difficult to form the memory gate electrode MG over the side wall of the control gate electrode CG. In other words, when the height of the control gate electrode CG lowers, it becomes difficult to form the sidewall over the side wall of the control gate electrode CG. That is, since the memory gate electrode MG is formed by anisotropically etching the polysilicon film PF3, when the height of the control gate electrode CG is low, the height of the memory gate electrode MG and the length thereof in the gate length direction also decrease. As a result, it becomes impossible to ensure a gate length inherently required for the memory gate electrode MG.

By contrast, in Embodiment 1, the boost gate electrode BG is formed over the control gate electrode CG, and the memory gate electrode MG having the sidewall shape is formed over the respective side walls of the control gate electrode CG and the boost gate electrode BG. That is, in Embodiment 1, the memory gate electrode MG can be formed using the side wall of a height which is the sum of the height of the control gate electrode CG and the height of the boost gate electrode BG. This offers the advantage of ease of processing the memory gate electrode MG having the sidewall shape. That is, the boost gate electrode BG formed in Embodiment 1 achieves not only the intended purpose of being used for the capacitive coupling, but also the secondary effect of facilitating the processing of the memory gate electrode MG having the sidewall shape. In other words, in Embodiment 1, by forming the boost gate electrode BG over the control gate electrode CG, it is possible to ensure the gate length of the memory gate electrode MG. This allows the reliability of the nonvolatile memory to be ensured.

The semiconductor device in Embodiment 1 is thus configured. Hereinbelow, the operation of each of the memory cells will be described. Here, it is assumed that a voltage applied to the control gate electrode CG is VCG, a voltage applied to the memory gate electrode MG is VMG, and a voltage applied to the boost gate electrode BG is VBG. It is also assumed that respective voltages applied to the source region and the drain region are VS and VD. Injection of electrons into the silicon nitride film serving as the charge accumulation film EC is defined as "writing", and injection of holes into the silicon nitride film is defined as "erasing".

Figure 9:
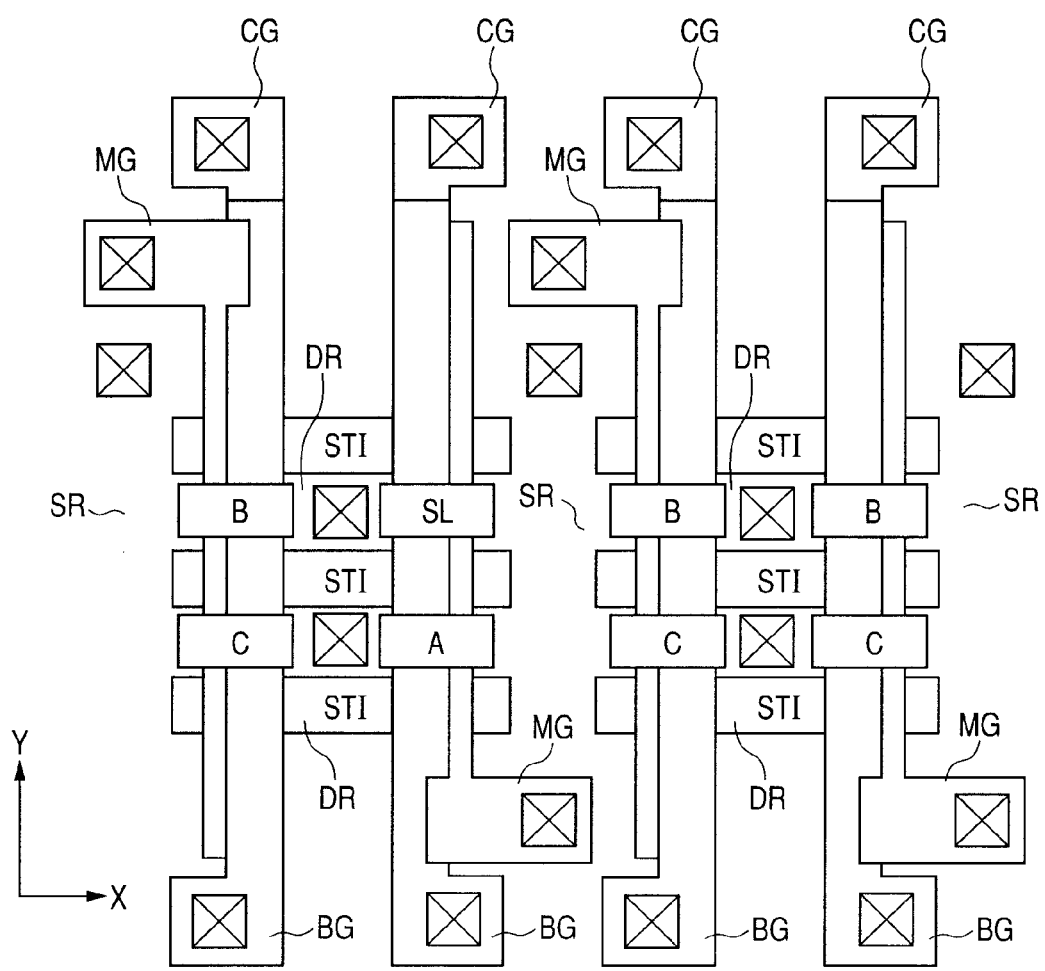
FIG. 9 is a plan view showing an example of a layout configuration of a nonvolatile memory including a plurality of memory cell formation areas and a plurality of lead-out areas, which is a plan view showing a plurality of memory cells.

First, a write operation will be described. FIG. 9 is a plan view showing a layout configuration of a nonvolatile memory including a plurality of memory cell formation areas and a plurality of lead-out areas, in which a memory cell SL and memory cells A to C are shown. Here, the memory cell SL indicates a selected memory cell which is a write target, while the memory cells A to C indicate non-selected memory cells which are not write targets.

FIG. 10 is a table showing conditions for voltages applied to the memory cell SL and the memory cells A to C. In each of the memory cell SL and the memory cells A to C, the boost gate electrode BG, the memory gate electrode MG, and the source region SR are electrically coupled. The voltage VBG is 8 V, the voltage VMG is 8 V, and the voltage VS is 5 V. On the other hand, in each of the memory cell SL and the memory cells A to C, different voltages are applied to the control gate electrode CG and the drain region DR. Specifically, to the control gate electrode CG of each of the memory cells SL and A, 1 V is applied and, to the control gate electrode CG of each of the memory cells B and C, 0 V is applied. In addition, to the drain region DR of each of the memory cells SL and B, 0.5 V is applied and, to the drain region DR of each of the memory cells A and C, 1.5 V is applied. Under the conditions for the voltages shown in FIG. 10, the memory cell SL is selected, while the other memory cells A to C are in a non-selected state.

The write operation is performed by hot electron writing referred to as a so-called source-side injection method. In the present specification, it is assumed that a semiconductor region to which a high voltage is applied during the write operation is consistently referred to as the source region, and a region to which a low voltage is applied during the write operation is consistently referred to as the drain region.

First, using the capacitive coupling, the voltage VMG applied to the memory gate electrode MG is boosted. Specifically, as shown in FIG. 3, at a time t1, 8 V is applied to the memory gate electrode MG. At this time, 0 V is sill applied to the boost gate electrode BG. Then, after the time t1, the memory gate electrode MG is brought into the floating state. Then, at a time t2, 8 V is applied to the boost gate electrode BG. That is, at the time t2, the voltage of the boost gate electrode BG changes from 0 V to 8 V. Consequently, the voltage of the memory gate electrode MG in the floating state rises to, e.g., 11.2 V through the capacitive coupling. In this manner, the voltage applied to the memory gate electrode MG can be boosted through the capacitive coupling.

Subsequently, by giving a potential difference between the voltage VS applied to the source region SR and the voltage VD applied to the drain region DR, electrons flow in a channel region formed between the source region SR and the drain region DR. The electrons flowing in the channel region are accelerated in the channel region (between the source region SR and the drain region DR) under the vicinity of the boundary between the control gate electrode CG and the memory gate electrode MG to become hot electrons. Then, in a vertically oriented electric field resulting from the positive voltage (VMG=11.2 V) applied to the memory gate electrode MG, hot electrons are injected into the silicon nitride film (charge accumulation film EC) under the memory gate electrode MG. The injected hot electrons are trapped by the trap level in the silicon nitride film. As a result, the electrons are accumulated in the silicon nitride film to increase the threshold voltage of the memory transistor. In this manner, the write operation to the memory cell SL is performed.

Figure 11:
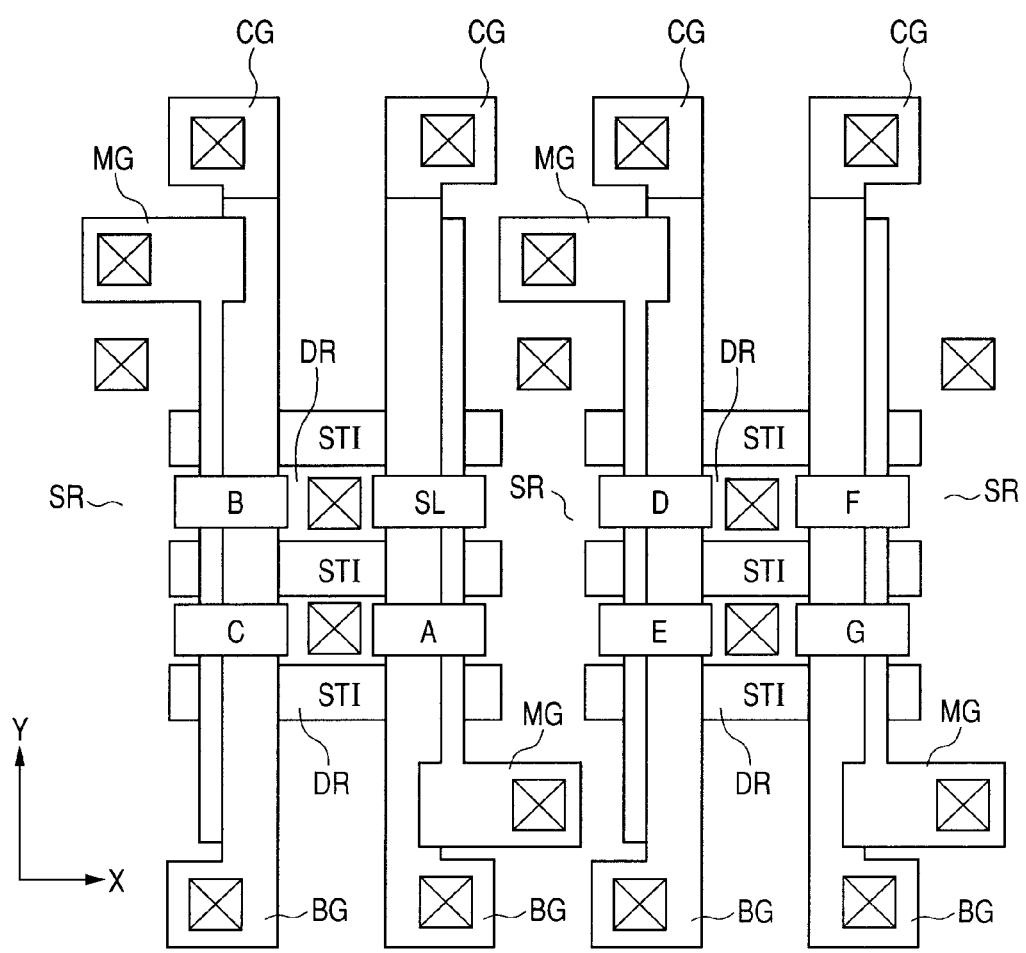
FIG. 11 is a plan view showing an example of a layout configuration of a nonvolatile memory including a plurality of memory cell formation areas and a plurality of lead-out areas, which is a plan view showing the plurality of memory cells.

Next, a write operation with a different configuration will be described. FIG. 11 is a plan view showing a layout configuration of a nonvolatile memory including a plurality of memory cell formation areas and a plurality of lead-out areas, in which the memory cell SL and the memory cells A to G are shown. Here, a memory cell SL indicates a selected memory cell which is a write target, and memory cells A to G indicate non-selected memory cells which are not write targets. Here, FIG. 11 is different from FIG. 9 in that the respective memory gate electrodes MG of the memory cells SL, A, F, and G and the respective memory gate electrodes MG of the memory cells B to E are isolated from each other, and different voltages can be applied thereto.

FIG. 12 is a table showing the conditions for the voltages applied to the memory cell SL and the memory cells A to G. In each of the memory cell SL and the memory cells A to G, the boost gate electrode BG and the source region SR are electrically coupled. The voltage VBG is 8 V, and the voltage VS is 5 V. On the other hand, in each of the memory cell SL and the memory cells A to G, different voltages are applied to the memory gate electrode MG, the control gate electrode CG, and the drain region DR. Specifically, to the memory gate electrode MG of each of the memory cells SL, A, F, and G, 8 V is applied and, to the memory gate electrode MG of each of the memory cells B to E, 3.5 V is applied. By thus lowering the voltage applied to the memory gate electrode MG of each of the memory cells B to E that are the non-selected memory cells, it is possible to inhibit erroneous writing (disturb) to the non-selected memory cells.

To the control gate electrode CG of each of the memory cells SL and A, 1 V is applied and, to the control gate electrode CG of each of the memory cells B to G, 0 V is applied. In addition, to the drain region DR of each of the memory cells SL, B, D, and F, 0.5 V is applied and, to the drain region DR of each of the memory cells A, C, E, and G, 1.5 V is applied. Under the conditions for the voltages shown in FIG. 12, the memory cell SL is selected, while the other memory cells A to G are in a non-selected state.

First in the write operation, using the capacitive coupling, the voltage VMG applied to the memory gate electrode MG is boosted. Specifically, as shown in FIG. 3, at a time t1, 8 V is applied to the memory gate electrode MG. At this time, 0 V is still applied to the boost gate electrode BG. Then, after the time t1, the memory gate electrode MG is brought into the floating state. Then, at a time t2, 8 V is applied to the boost gate electrode BG. That is, at the time t2, the voltage of the boost gate electrode BG changes from 0 V to 8 V. As a result, the voltage of the memory gate electrode MG in the floating state rises to, e.g., 11.2 V through the capacitive coupling. In this manner, the voltage applied to the memory gate electrode MG can be boosted through the capacitive coupling.

Note that the memory gate electrode MG of each of the memory cells B to E is not brought into the floating state, and 3.5 V remains applied thereto so that capacitive coupling does not occur. Therefore, it is possible to lower the voltage VMG applied to the memory gate electrode MG of each of the memory cells B to E that are the non-selected memory cells, and thereby inhibit erroneous writing (disturb).

Subsequently, by giving a potential difference between the voltage VS applied to the source region SR and the voltage VD applied to the drain region DR, electrons flow in a channel region formed between the source region SR and the drain region DR. The electrons flowing in the channel region are accelerated in the channel region (between the source region SR and the drain region DR) under the vicinity of the boundary between the control gate electrode CG and the memory gate electrode MG to become hot electrons. Then, in a vertically oriented electric field resulting from the positive voltage (VMG=11.2 V) applied to the memory gate electrode MG, hot electrons are injected into the silicon nitride film (charge accumulation film EC) under the memory gate electrode MG. The injected hot electrons are trapped by the trap level in the silicon nitride film. As a result, the electrons are accumulated in the silicon nitride film to increase the threshold voltage of the memory transistor. In this manner, the write operation to the memory cell SL is performed.

Subsequently, an erase operation will be described. The erase operation is performed by, e.g., FN erasing using a tunnel current or Band-to-Band Tunneling (BTBT) erasing using the phenomenon of band-to-band tunneling.

FIG. 13 is a table showing conditions for the voltages during the erase operation. In FIG. 13, conditions for an operation by FN erasing and conditions for an operation by BTBT erasing are shown.

The operation of FN erasing will be described. Specifically, as shown in FIG. 13, 10 V is applied to the boost gate electrode, and 10 V is applied to the memory gate electrode MG. To each of the control gate electrode CG, the source region SR, and the drain region DR, 0 V is applied.

Figure 14:
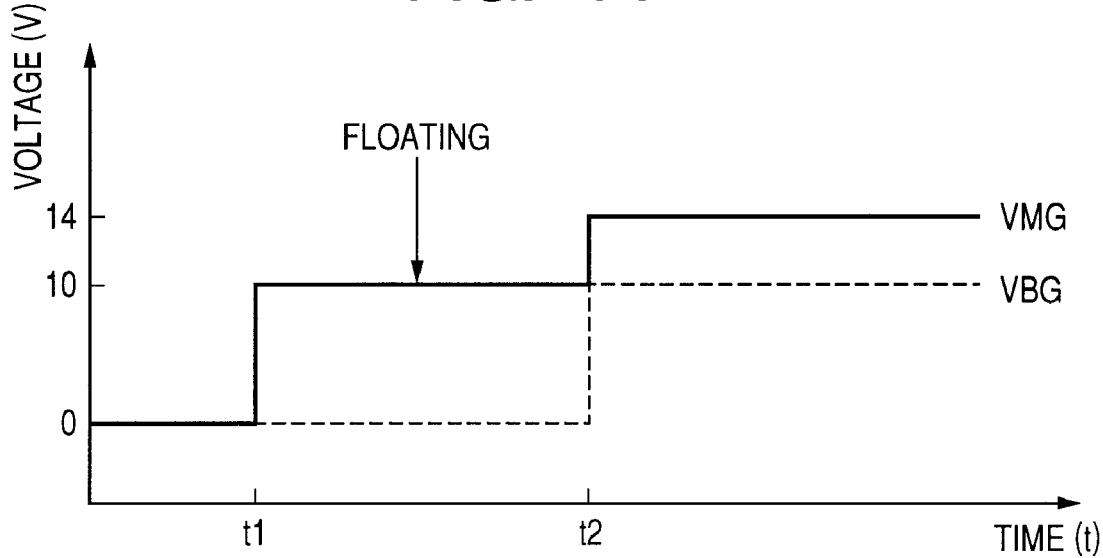
FIG. 14 is a timing chart for illustrating a voltage boosting operation during the erase operation.

First, using the capacitive coupling, the voltage VMG applied to the memory gate electrode MG is boosted. Specifically, as shown in FIG. 14, at a time t1, 10 V is applied to the memory gate electrode MG. At this time, 0 V is still applied to the boost gate electrode BG. Then, after the time t1, the memory gate electrode MG is brought into the floating state. Then, at a time t2, 10 V is applied to the boost gate electrode BG. That is, at the time t2, the voltage of the boost gate electrode BG changes from 0 V to 10 V. As a result, the voltage of the memory gate electrode MG in the floating state rises to, e.g., 14 V through the capacitive coupling. In this manner, the voltage applied to the memory gate electrode MG can be boosted through the capacitive coupling.

Thereafter, with the voltage (14 V) applied to the memory gate electrode MG, the electrons accumulated in the charge accumulation film tunnel through the potential barrier film (FN tunnel current) to be extracted to the memory gate electrode MG. As a result, the threshold voltage of the memory transistor lowers. In this manner, the erase operation is performed.

Next, the operation of BTBT erasing will be described. Specifically, as shown in FIG. 13, 0 V is applied to the boost gate electrode BG, and −6 V is applied to the memory gate electrode MG. To the source region SR, 6 V is applied and, to the control gate electrode CG, 0 V is applied. To the drain region DR, 1.5 V is applied.

As a result, with the voltage placed between the source region SR and the memory gate electrode MG, hot holes are generated due to the phenomenon of band-to-band tunneling in the end portion of the source region. Then, some of the hot holes are attracted by the negative voltage applied to the memory gate electrode MG, and injected into the silicon nitride film serving as the charge accumulation film. The injected hot holes are trapped by the trap level in the silicon nitride film to lower the threshold voltage of the memory transistor. In this manner, the erase operation is performed.

Finally, a read operation will be described. Reading is performed by setting the voltage VD applied to the drain region to Vdd (1 V), setting the voltage VS applied to the source region to 0 V, setting the voltage VCG applied to the control gate electrode CG to Vdd (1.5 V), setting the voltage VMG applied to the memory gate electrode MG to 0 V, and causing a current to flow in a direction reverse to the direction during writing. It is also possible that the voltage VD applied to the drain region and the voltage VS applied to the source region may be switched and respectively set to 0 V and 1 V, and reading in which the current flows in the same direction as during writing may be performed. At this time, when the memory cell is in a write state and the threshold voltage is high, a current does not flow in the memory cell. On the other hand, when the memory cell is in an erase state and the threshold voltage is low, a current flows in the memory cell.

Thus, whether the memory cell is in the write state or in the erase state can be determined by detecting the presence or absence of a current flowing in the memory cell. Specifically, with a sense amplifier, the presence or absence of a current flowing in the memory cell is detected. For example, to detect the presence or absence of a current flowing in the memory cell, a reference current is used. That is, when the memory cell is in the erase state, a read current flows during reading, and is compared with the reference current. The reference current is set lower than the read current in the erase state. As a result of comparing the read current with the reference current, when the read current is larger than the reference current, it can be determined that the memory cell is in the erase state. On the other hand, when the memory cell is in the write state, the read current does not flow. That is, as a result of comparing the read current with the reference current, when the read current is smaller than the reference current, it can be determined that the memory cell is in the write state. In this manner, the read operation can be performed.

The semiconductor device in Embodiment 1 is thus configured. Hereinbelow, a manufacturing method thereof will be described with reference to the drawings. FIGS. 15 to 23 are cross-sectional views illustrating process steps of manufacturing the semiconductor device in Embodiment 1. In each of FIGS. 15 to 23, the memory cell formation area AR1, the lead-out area AR2, the capacitive element formation area AR3, and the peripheral circuit formation area AR4 are shown.

Figure 15:
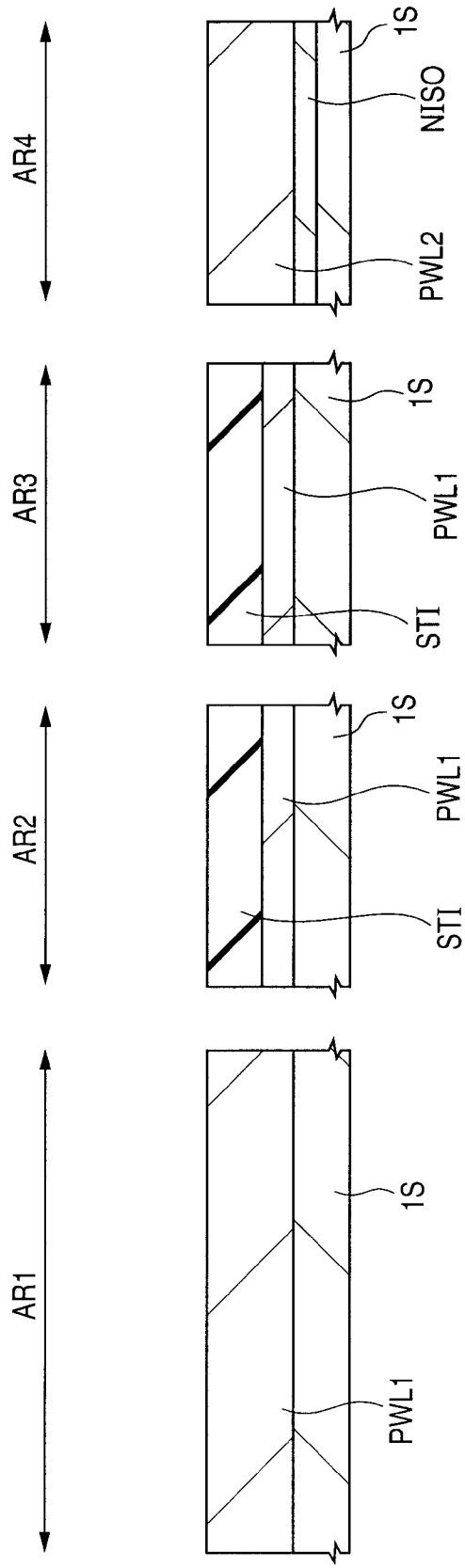
FIG. 15 is a cross-sectional view showing a process step of manufacturing the semiconductor device in Embodiment 1.

First, as shown in FIG. 15, the semiconductor substrate 1S comprised of monocrystalline silicon containing a p-type impurity such as boron introduced therein is prepared. At this time, the semiconductor substrate 1S is in the state of a semiconductor wafer having a generally disc-like shape. Then, the isolation regions STI are formed over the semiconductor substrate 1S. The isolation regions STI are provided so as to, e.g., prevent mutual interference between elements. The isolation regions STI can be formed using, e.g., a local oxidation of silicon (LOCOS) method or a shallow trench isolation (STI) method. For example, in the STI method, the isolation regions STI are formed as follows. That is, in the semiconductor substrate 1S, isolation trenches are formed using a photolithographic technique and an etching technique. Then, over the semiconductor substrate 1S, an insulating film (such as a silicon dioxide film) is formed so as to be buried in the isolation trenches. Thereafter, by a chemical mechanical polishing (CMP) method, the unneeded silicon dioxide film formed over the semiconductor substrate 1S is removed. In this manner, the isolation regions STI in which the insulating film (such as a silicon dioxide film) is buried only in the isolation trenches can be formed.

Subsequently, an impurity is introduced into the semiconductor substrate 1S in the peripheral circuit formation area AR4 to form the well isolation layer NISO. The well isolation layer NISO is formed by introducing an n-type impurity such as phosphorus or arsenic into the semiconductor substrate 1S. Thereafter, by introducing an impurity into the semiconductor substrate 1S, the p-type well PWL1 is formed in the memory cell formation area AR1 and the p-type well PWL2 is formed in the peripheral circuit formation area AR4. The p-type wells PWL1 and PWL2 are formed by, e.g., introducing a p-type impurity such as boron into the semiconductor substrate 1S by an ion implantation method.

Figure 16:
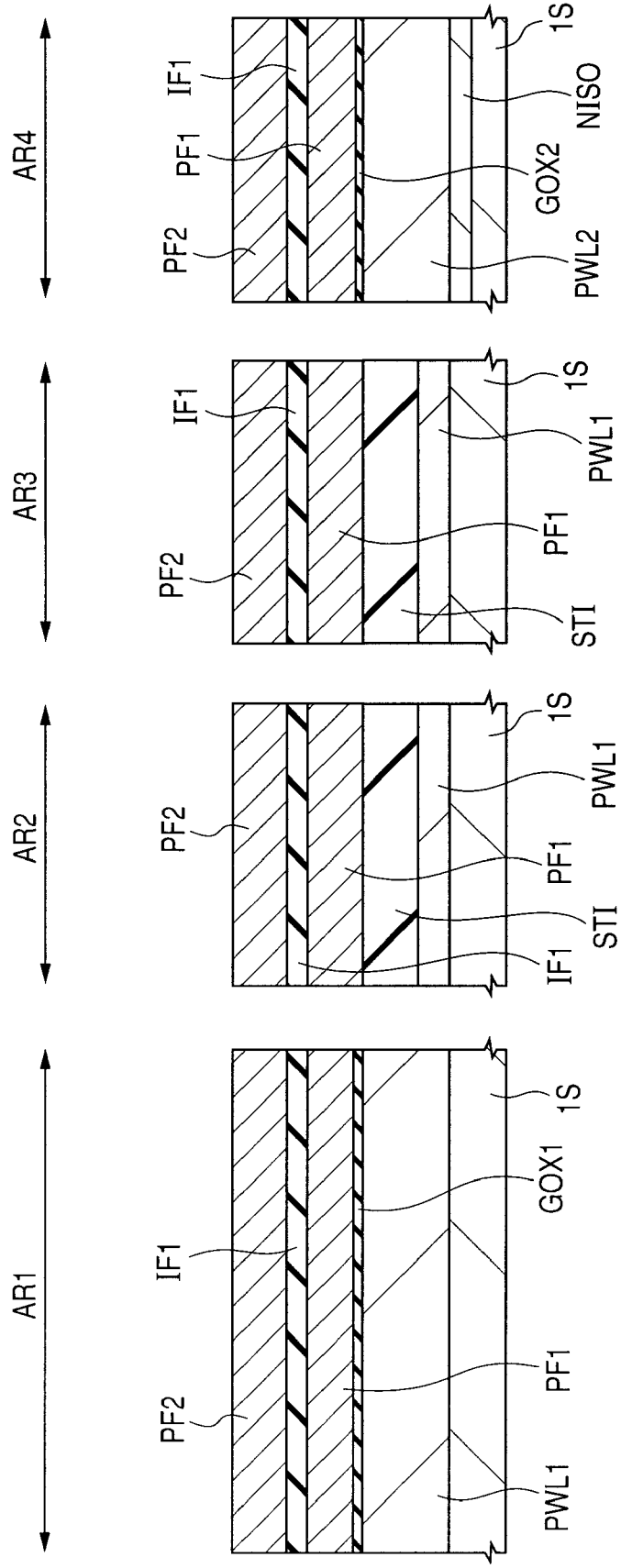
FIG. 16 is a cross-sectional view showing a process step of manufacturing the semiconductor device, which is subsequent to FIG. 15.

Next, as shown in FIG. 16, the gate insulating film GOX1 is formed over the semiconductor substrate 1S in the memory cell formation area AR1, while the gate insulating film GOX2 is formed over the semiconductor substrate 1S in the peripheral circuit formation area AR4. Each of the gate insulating films GOX1 and GOX2 is formed of an insulating film such as, e.g., a silicon dioxide film, and can be formed using, e.g., a thermal oxidation method. However, each of the gate insulating films GOX1 and GOX2 is not limited to a silicon dioxide film, and can be variously modified. For example, each of the gate insulating films GOX1 and GOX2 may also be formed of a silicon oxynitride (SiON) film. That is, nitrogen may also be segregated at the interfaces between the gate insulating films GOX1 and GOX2 and the semiconductor substrate 1S. A silicon oxynitride film is higher in the effect of inhibiting the occurrence of an interface state and reducing electron traps in the film than a silicon dioxide film. Accordingly, the hot carrier resistance of each of the gate insulating films GOX1 and GOX2 can be improved, and the dielectric strength can be improved. In addition, a silicon oxynitride film is more resistant to impurity penetration than a silicon dioxide film. Therefore, by using a silicon oxynitride film as each of the gate insulating films GOX1 and GOX2, it is possible to inhibit threshold voltage fluctuations resulting from the diffusion of the impurity in the gate electrode toward the semiconductor substrate 1S. The formation of a silicon oxynitride film may be performed appropriately by subjecting the semiconductor substrate 1S to heat treatment in an atmosphere containing nitrogen such as NO, $NO_2$, or $NH_3$. Otherwise, after the gate insulating films GOX1 and GOX2 each comprised of a silicon dioxide film are formed over the surface of the semiconductor substrate 1S, if the semiconductor substrate 1S is subjected to heat treatment in an atmosphere containing nitrogen, and nitrogen is segregated at the respective interfaces between the gate insulating films GOX1 and GOX2 and the semiconductor substrate 1S, the same effect can be obtained.

Each of the gate insulating film GOX1 and GOX2 may also be formed of, e.g., a high-dielectric-constant film having a dielectric constant higher than that of a silicon dioxide film. Conventionally, in terms of high dielectric strength and the high electrical/physical stabilities of a Si—$SiO_2$ interface, a silicon dioxide film has been used as each of the gate insulating films GOX1 and GOX2. However, with the miniaturization of elements, an ultimate thickness reduction has been required of each of the gate insulating films GOX1 and GOX2. If such a thin silicon dioxide film is used as each of the gate insulating films GOX1 and GOX2, a so-called tunnel current occurs in which electrons flowing in the channel of the MISFET tunnel through a barrier formed by the silicon dioxide film, and flow into the gate electrode.

To prevent this, a high-dielectric-constant film has been used which uses a material having a dielectric constant higher than that of a silicon dioxide film, and thereby allows a physical film thickness to be increased even with the same capacitance. With a high-dielectric-constant film, a physical film thickness can be increased even though the capacitance is set the same, and therefore a leakage current can be reduced. A silicon nitride film also has a dielectric constant higher than that of a silicon dioxide film but, in Embodiment 1, it is particularly desired to use a high-dielectric-constant film having a dielectric constant higher than that of the silicon nitride film.

For example, as a high-dielectric-constant film having a dielectric constant higher than that of the silicon nitride film, a film of hafnium dioxide ($HfO_2$) which is among hafnium oxides is used. However, instead of the hafnium dioxide film, another hafnium-based insulating film such as a hafnium aluminate (HfAlO) film, a hafnium oxynitride (HfON) film, a hafnium silicate (HfSiO) film, or a hafnium silicon oxynitride (HfSiON) film. Besides, a hafnium-based insulating film obtained by introducing an oxide such as tantalum oxide, niobium oxide, titanium oxide, zirconium oxide, lanthanum oxide, or yttrium oxide into any of these hafnium-based insulating films can also be used. Since a hafnium-based insulating film has a dielectric constant higher than that of a silicon dioxide film or a silicon oxynitride film, similarly to a hafnium dioxide film, the same effects as obtained when a hafnium dioxide film is used can be obtained.

Subsequently, the polysilicon film PF1 is formed over the entire main surface of the semiconductor substrate 1S. Specifically, in the memory cell formation area AR1, the polysilicon film PF1 is formed over the gate insulating film GOX1, while the polysilicon film PF1 is formed over the isolation region STI in the lead-out area AR2. In the capacitive element formation area AR3, the polysilicon PF1 is formed over the isolation region STI, while the polysilicon film PF1 is formed over the gate insulating film GOX2 in the peripheral circuit formation area AR4.

Thereafter, over the polysilicon film PF1, the insulating film IF1 is formed and, over the insulating film IF1, the polysilicon film PF2 is formed. The insulating film IF1 can be formed of an insulating film such as, e.g., a silicon dioxide film, but may also be formed of a multilayer insulating film (ONO film) of a silicon dioxide film, a silicon nitride film, and a silicon dioxide film.

Figure 17:
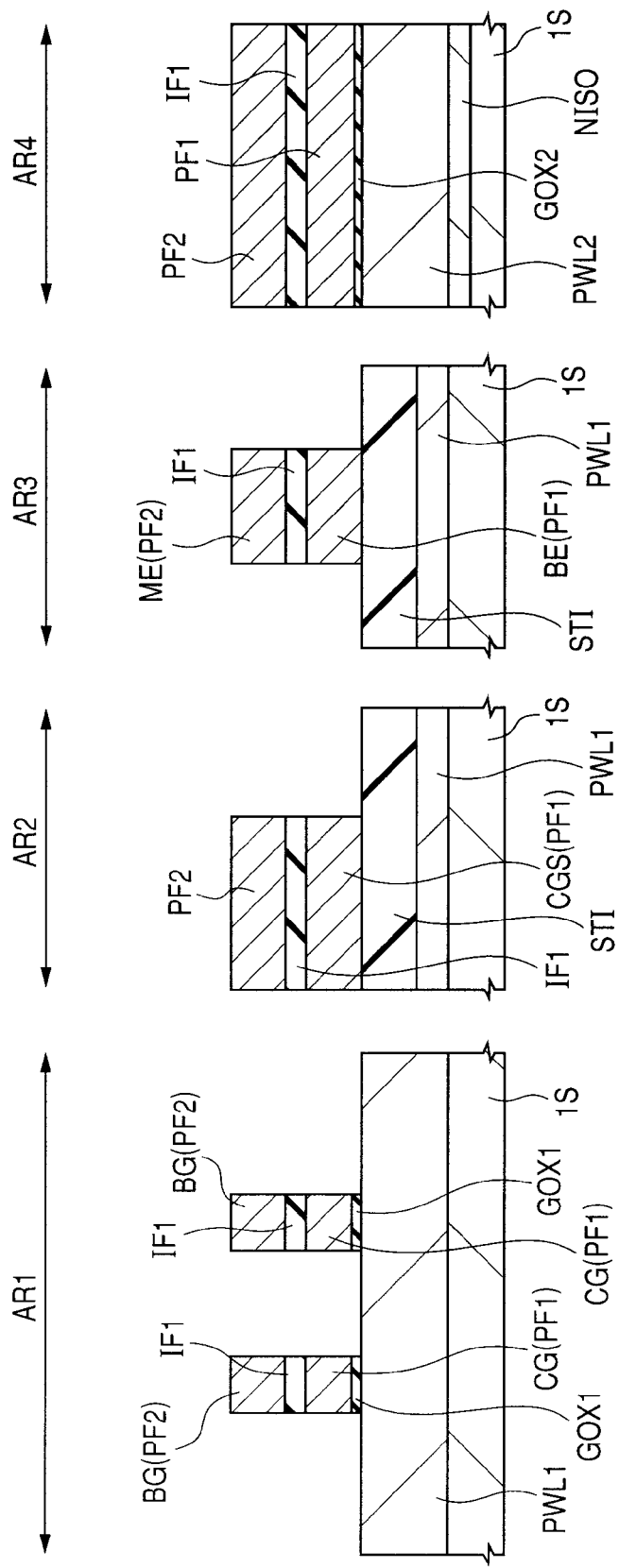
FIG. 17 is a cross-sectional view showing a process step of manufacturing the semiconductor device, which is subsequent to FIG. 16.

Next, as shown in FIG. 17, by using a photolithographic technique and an etching technique, the polysilicon film PF2, the insulating film IF1, and the polysilicon film PF1 are successively processed. Specifically, in the memory cell formation area AR1, the polysilicon film PF2, the insulating film IF1, and the polysilicon film PF1 are processed to form the boost gate electrode BG comprised of the polysilicon film PF2 and the control gate electrode CG comprised of the polysilicon film PF1. In the lead-out area AR2 also, the polysilicon film PF2, the insulating film IF1, and the polysilicon film PF1 are processed. At this time, by processing the polysilicon film PF1, the lead-out electrode CGS is formed. In the capacitive element formation area AR3, the polysilicon film PF2 is processed to form the middle electrode ME, and the polysilicon film PF1 is processed to form the base electrode BE. The insulating film IF1 interposed between the base electrode BE and the middle electrode ME serves as the capacitor insulating film. On the other hand, in the peripheral circuit formation area AR4, the processing of the polysilicon film PF2, the insulating film IF1, and the polysilicon film PF1 is not performed. As a result, in the peripheral circuit formation area AR4, the polysilicon film PF1, the insulating film IF1, and the polysilicon film PF2 remain in a deposited state.

Figure 18:
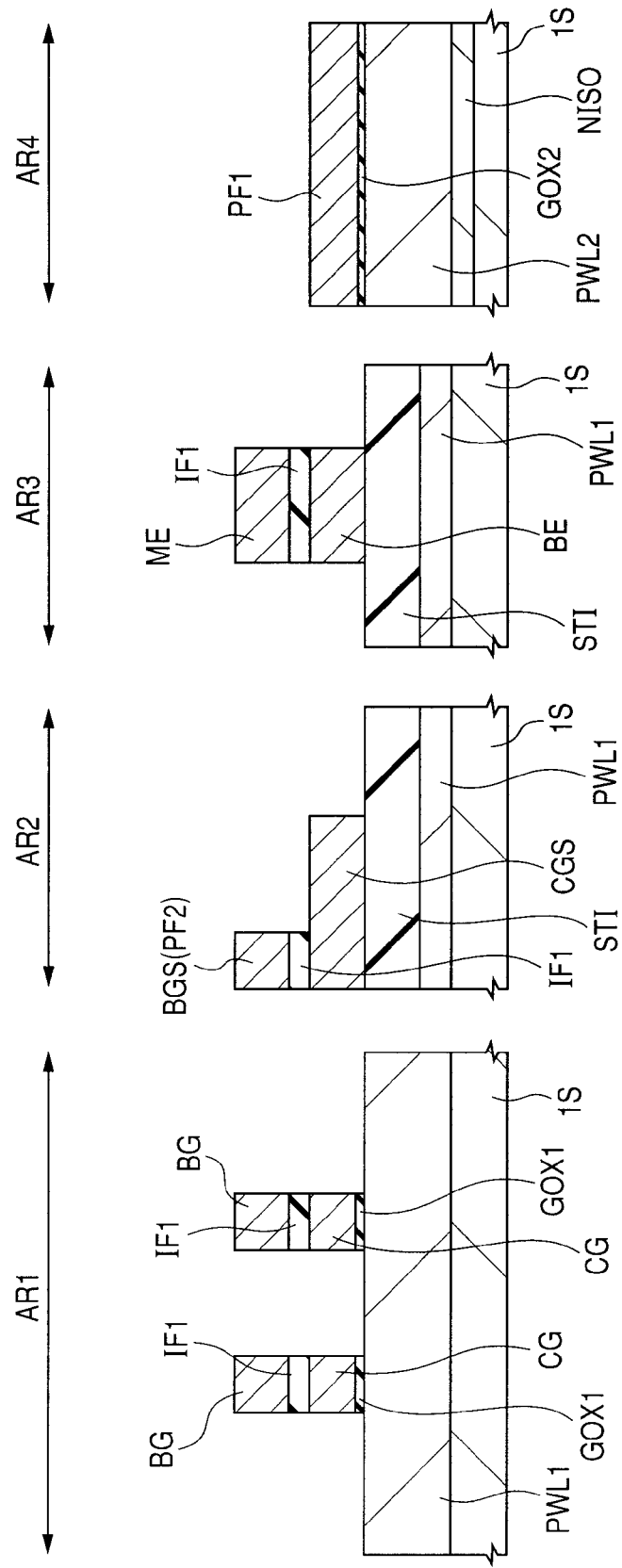
FIG. 18 is a cross-sectional view showing a process step of manufacturing the semiconductor device, which is subsequent to FIG. 17.

Subsequently, as shown in FIG. 18, by further using a photolithographic technique and an etching technique, the polysilicon film PF2 and the insulating film IF1 are processed. Specifically, in the lead-out area AR2, the insulating film IF1 and the polysilicon film PF2 each formed over the lead-out electrode CGS are processed to form the lead-out electrode BGS. At this time, the end portion of the lead-out electrode CGS formed in a layer under the lead-out electrode BGS is exposed, while the polysilicon film PF2 and the insulating film IF1 each formed in the peripheral circuit formation area AR4 are removed.

Figure 19:
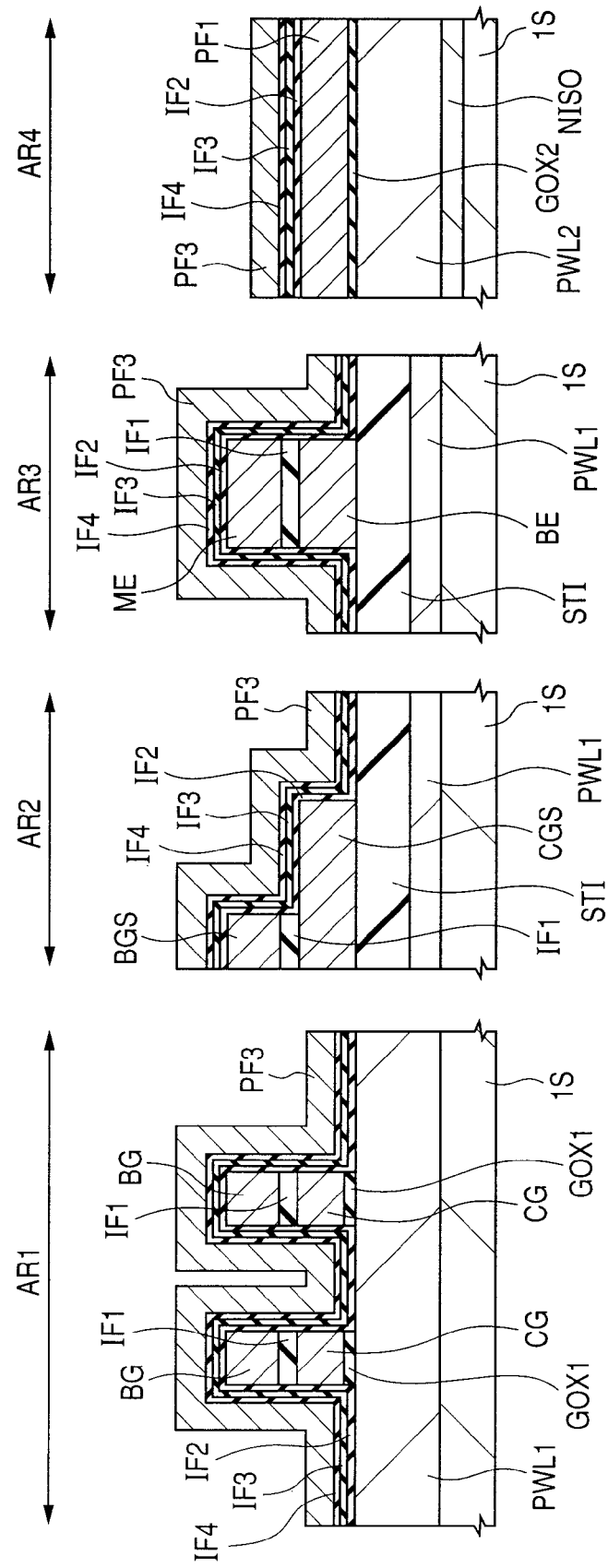
FIG. 19 is a cross-sectional view showing a process step of manufacturing the semiconductor device, which is subsequent to FIG. 18.

Thereafter, as shown in FIG. 19, over the entire surface of the semiconductor substrate 1S, the insulating film IF2 is formed as an insulating film serving as the potential barrier film EB1 described later and, over the insulating film IF2, the insulating film IF3 is formed as an insulating film serving as the charge accumulation film EC described later. Then, over the insulating film IF3, the insulating film IF4 is formed as an insulating film serving as the potential barrier film FB2 described later and, over the insulating film IF4, the polysilicon film PF3 is formed. For example, the insulating film IF2 is formed of a silicon dioxide film, and can be formed using, e.g., a thermal oxidation method or an ISSG oxidation method. The insulating film IF3 is formed of a silicon nitride film, and can be formed using, e.g., a CVD method. The insulating film IF4 is formed of a silicon dioxide film, and can be formed using, e.g., an ISSG oxidation method or a CVD method. On the other hand, the polysilicon film PF3 can be formed using, e.g., a CVD method.

Specifically, in the memory cell formation area AR1, the insulating films IF2 to IF4 and the polysilicon film PF3 are formed so as to cover the control gate electrode CG and the boost gate electrode BG each formed over the semiconductor substrate 1S. In the lead-out area AR2, the insulating films IF2 to IF4 and the polysilicon film PF3 are formed so as to cover the lead-out electrodes CGS and BGS each formed over the isolation region STI. In the capacitive element formation area AR3, the insulating films IF2 to IF4 and the polysilicon film PF3 are formed so as to cover the base electrode BE and the middle electrode ME. On the other hand, in the peripheral circuit formation area AR4, the insulating films IF2 to IF4 and the polysilicon film PF3 are formed over the polysilicon film PF1.

Figure 20:
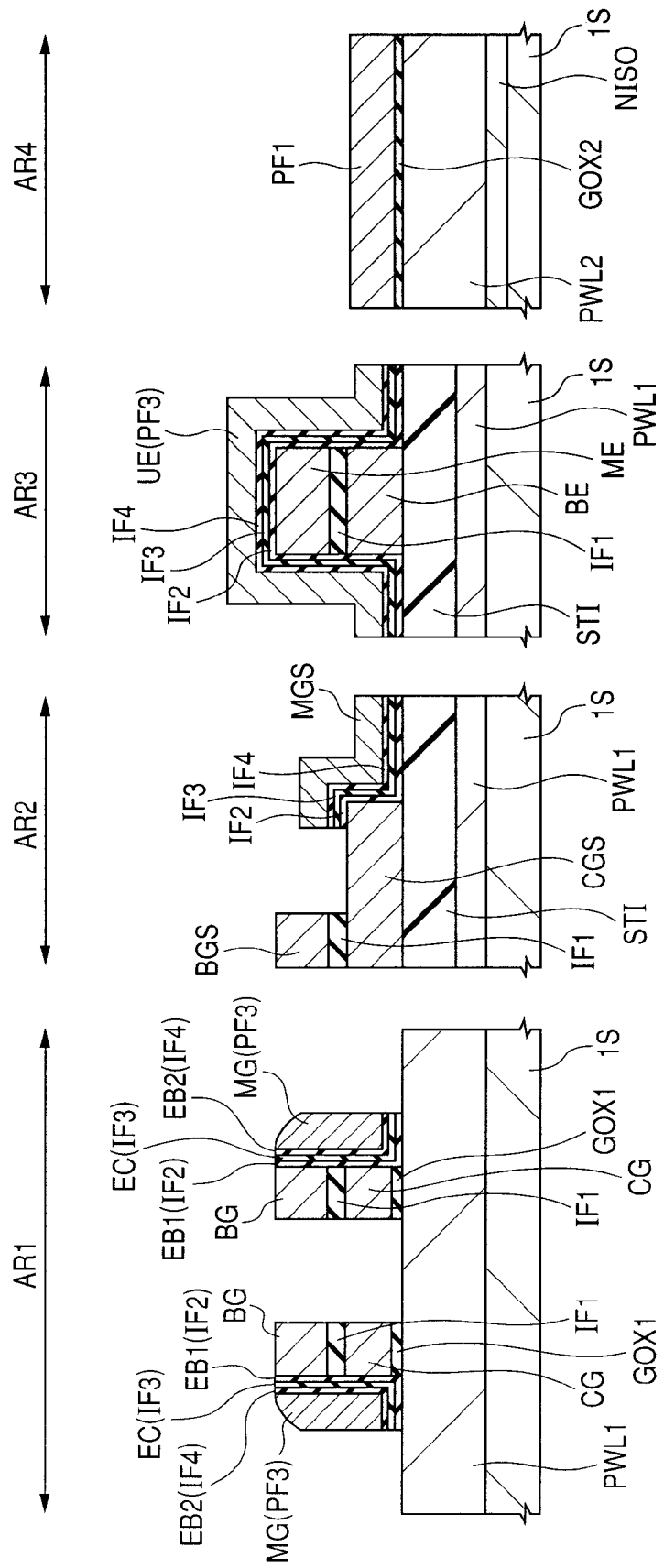
FIG. 20 is a cross-sectional view showing a process step of manufacturing the semiconductor device, which is subsequent to FIG. 19.

Next, as shown in FIG. 20, by using a photolithographic technique and an etching technique, the polysilicon film PF3 and the insulating films IF2 to IF4 are processed. Specifically, in the memory cell formation area AR1, by using anisotropic etching, the polysilicon film PF3 formed over the semiconductor substrate 1S is processed. As a result, the polysilicon film PF3 having the sidewall shape remains over each of the respective both side walls of the control gate electrode CG and the boost gate electrode BG. Thereafter, by using a photolithographic technique and an etching technique, in the memory cell formation area AR1, the polysilicon film PF3 having the sidewall shape and formed on one side of each of the control gate electrode CG and the boost gate electrode BG is removed. As a result, the polysilicon film PF3 having the sidewall shape remains only on respective one side walls of the control gate electrode CG and the boost gate electrode BG. By further removing the exposed multilayer insulating film (of the insulating films IF2, IF3, and IF4), the memory gate electrode MG having the sidewall shape can be formed over the respective one side walls of the control gate electrode CG and the boost gate electrode BG via the multilayer insulating film. At this time, the multilayer insulating film is comprised of the insulating films IF2 to IF4 and, for example, the insulating film IF2 serves as the potential barrier film FB1 and the insulating film IF3 serves as the charge accumulation film EC. In addition, the insulating film IF4 serves as the potential barrier film EB2.

On the other hand, in the lead-out area AR2, the insulating films IF2 to IF4 and the polysilicon film PF3 are processed such that parts thereof rise and rest on the end portion of the lead-out electrode CGS.

At this time, the gate length of the memory gate electrode MG having the sidewall shape depends on the respective heights of the control gate electrode CG and the boost gate electrode BG. For example, in the case where the boost gate elect BG is not formed over the control gate electrode CG, the memory gate electrode MG is formed over the side wall of the control gate electrode CG. However, since memory gate electrode MG is formed by anisotropically etching the polysilicon film PF3, when the height of the control gate electrode CG is low, the height of the memory gate electrode MG and the length in the gate length direction thereof also decrease. Accordingly, it becomes impossible to ensure a gate length inherently required for the memory gate electrode MG. For this reason, in Embodiment 1, the boost gate electrode BG is formed over the control gate electrode CG so as to be able to ensure the gate length of the memory gate electrode MG. This allows an improvement in the reliability of the nonvolatile memory.

In the capacitive element formation area AR3, the polysilicon film PF3 is processed to form the upper electrode UE. At this time, the multilayer insulating film (of the insulating films IF2 to IF4) interposed between the upper electrode UE and the middle electrode ME serves as the capacitor insulating film. Thus, in the capacitive element formation area AR3, the first capacitive element comprised of the base electrode BE, the insulating film IF1, and the middle electrode ME and the second capacitive element comprised of the middle electrode ME, the multilayer insulating film (of the insulating films IF2 to IF4), and the upper electrode UE are formed.

On the other hand, in the peripheral circuit formation area AR4, the polysilicon film PF3 and the insulating films IF2 to IF4 are removed so that the polysilicon film PF1 is exposed.

Figure 21:
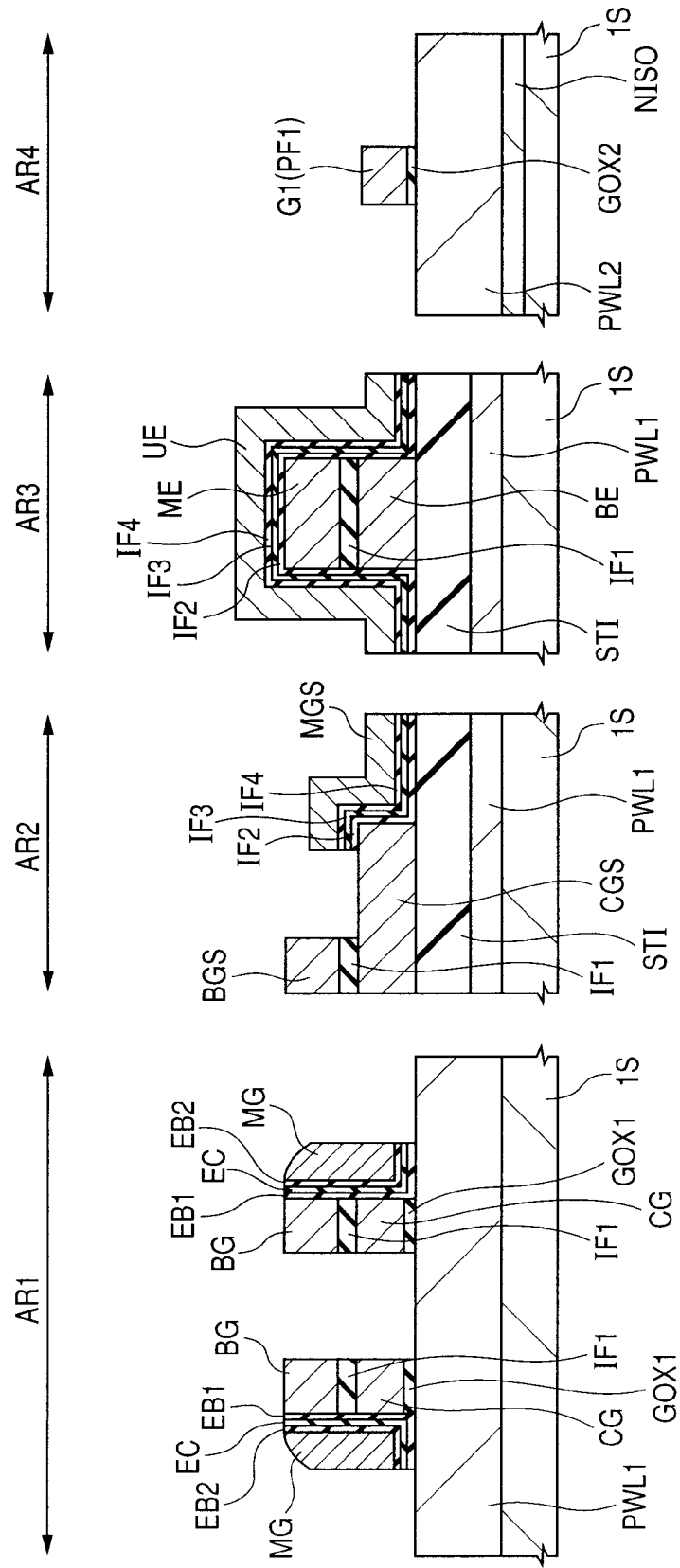
FIG. 21 is a cross-sectional view showing a process step of manufacturing the semiconductor device, which is subsequent to FIG. 20.

Next, by using a photolithographic technique and an ion implantation method, an n-type impurity such as phosphorus or arsenic is introduced into the polysilicon film PF1 in the peripheral circuit formation area AR4. Then, as shown in FIG. 21, by using a photolithographic technique and an etching technique, the polysilicon film PF1 formed in the peripheral circuit formation area AR4 is processed. In this manner, the gate electrode G1 comprised of the polysilicon film PF1 can be formed in the peripheral circuit formation area AR4.

Figure 22:
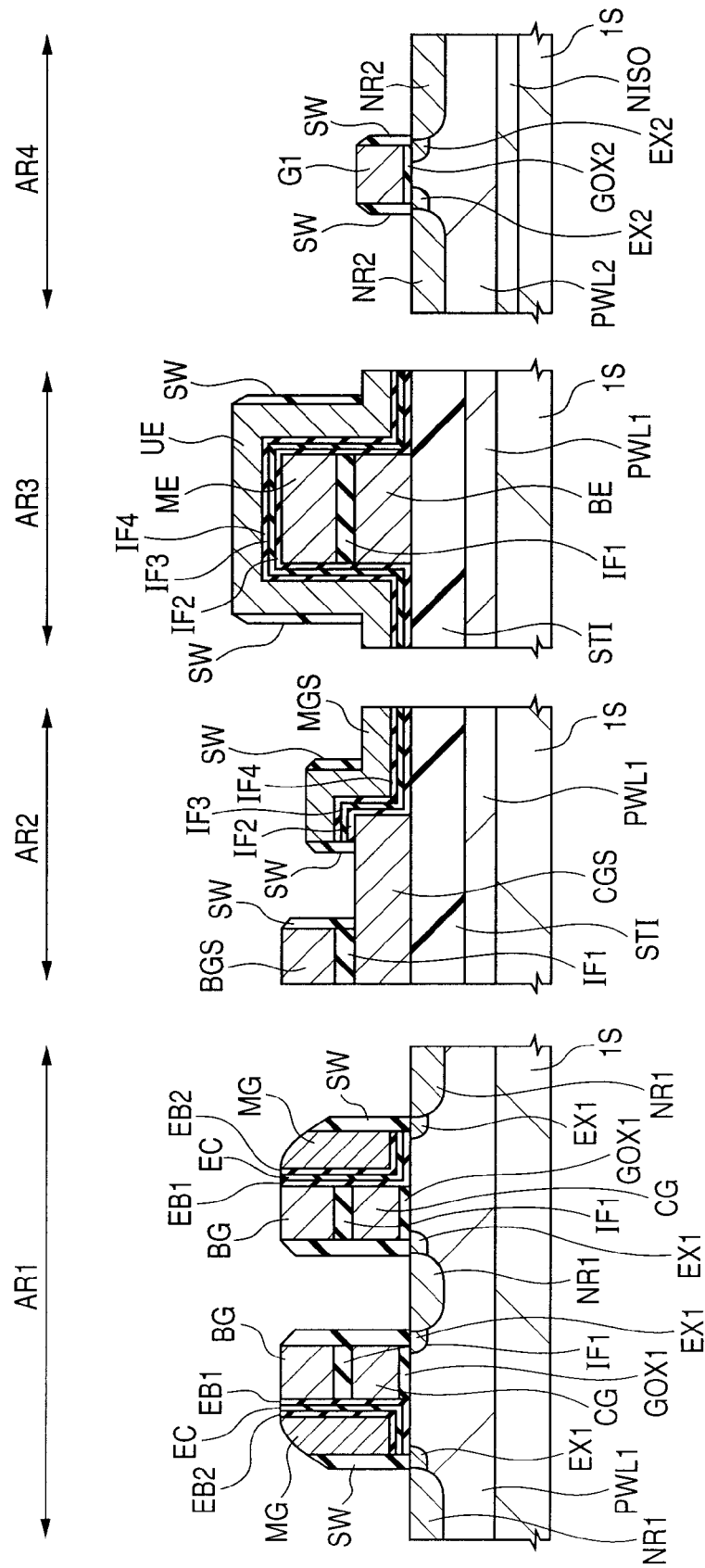
FIG. 22 is a cross-sectional view showing a process step of manufacturing the semiconductor device, which is subsequent to FIG. 21.

Subsequently, as shown in FIG. 22, by using a photolithographic technique and an ion implantation method, in the memory cell formation area AR1, the shallow low-concentration impurity diffusion regions EX1 aligned with the control gate electrode CG and the memory gate electrode MG are formed. The shallow low-concentration impurity diffusion regions EX1 are n-type semiconductor regions each containing an n-type impurity such as phosphorus or arsenic introduced therein. On the other hand, in the peripheral circuit formation area AR4, the shallow low-concentration impurity diffusion regions EX2 aligned with the gate electrode G1 are formed. The shallow low-concentration impurity diffusion regions EX2 are also n-type semiconductor regions each containing an n-type impurity introduced therein.

Thereafter, over the semiconductor substrate 1S, a silicon dioxide film is formed. The silicon dioxide film can be formed using, e.g., a CVD method. Then, by anisotropically etching the silicon dioxide film, the sidewalls SW are formed. In the memory cell formation area AR1, the sidewalls SW are formed over the respective side walls of the control gate electrode CG and the boost gate electrode BG and over the side wall of the memory gate electrode MG. In the lead-out area AR2, the sidewalls SW are formed over the side walls of the lead-out electrodes BGS and MGS. In the capacitive element formation area AR3, the sidewalls SW are formed over the side walls of the upper electrode UE. Likewise, in the peripheral circuit formation area AR4, the sidewalls SW are formed over the both side walls of the gate electrode G1. These sidewalls SW are each formed of a single-layered film of a silicon dioxide film, but not limited thereto. The sidewalls SW each comprised of a multilayer film of a silicon nitride film and a silicon dioxide film may also be formed.

Subsequently, by using a photolithographic technique and an ion implantation method, the deep high-concentration impurity diffusion regions NR1 aligned with the sidewalls SW are formed in the memory cell formation area AR1. The deep high-concentration impurity diffusion regions NR1 are n-type semiconductor regions containing an n-type impurity such as phosphorus or arsenic introduced therein. Of the deep high-concentration impurity diffusion region NR1 and the shallow low-concentration impurity diffusion region EX1, the source or drain region of the memory cell is formed. By thus forming the source and drain regions of the shallow low-concentration impurity diffusion regions EX1 and the deep high-concentration impurity diffusion regions NR1, each of the source and drain regions can be provided with a Lightly Doped Drain (LDD) structure.

On the other hand, in the peripheral circuit formation area AR4, the deep high-concentration impurity diffusion regions NR2 aligned with the sidewalls SW are formed. The deep high-concentration impurity diffusion regions NR2 are n-type semiconductor regions containing an n-type impurity such as phosphorus or arsenic introduced therein. Of the deep high-concentration impurity diffusion region NR2 and the shallow low-concentration impurity diffusion region EX2, the source or drain region of the MISFET is formed. By thus forming the source and drain regions of the shallow low-concentration impurity diffusion regions EX2 and the deep high-concentration impurity diffusion regions NR2, each of the source and drain regions can be provided with a Lightly Doped Drain (LDD) structure. At this time, the deep high-concentration impurity diffusion regions NR2 of the peripheral circuit formation area AR4 can also be formed commonly to and simultaneously with the deep high-concentration impurity diffusion regions NR1 of the memory cell formation area AR1.

After the deep high-concentration impurity diffusion regions NR1 and NR2 are thus formed, heat treatment is performed at about 1000° C., thereby activating the introduced impurity.

Figure 23:
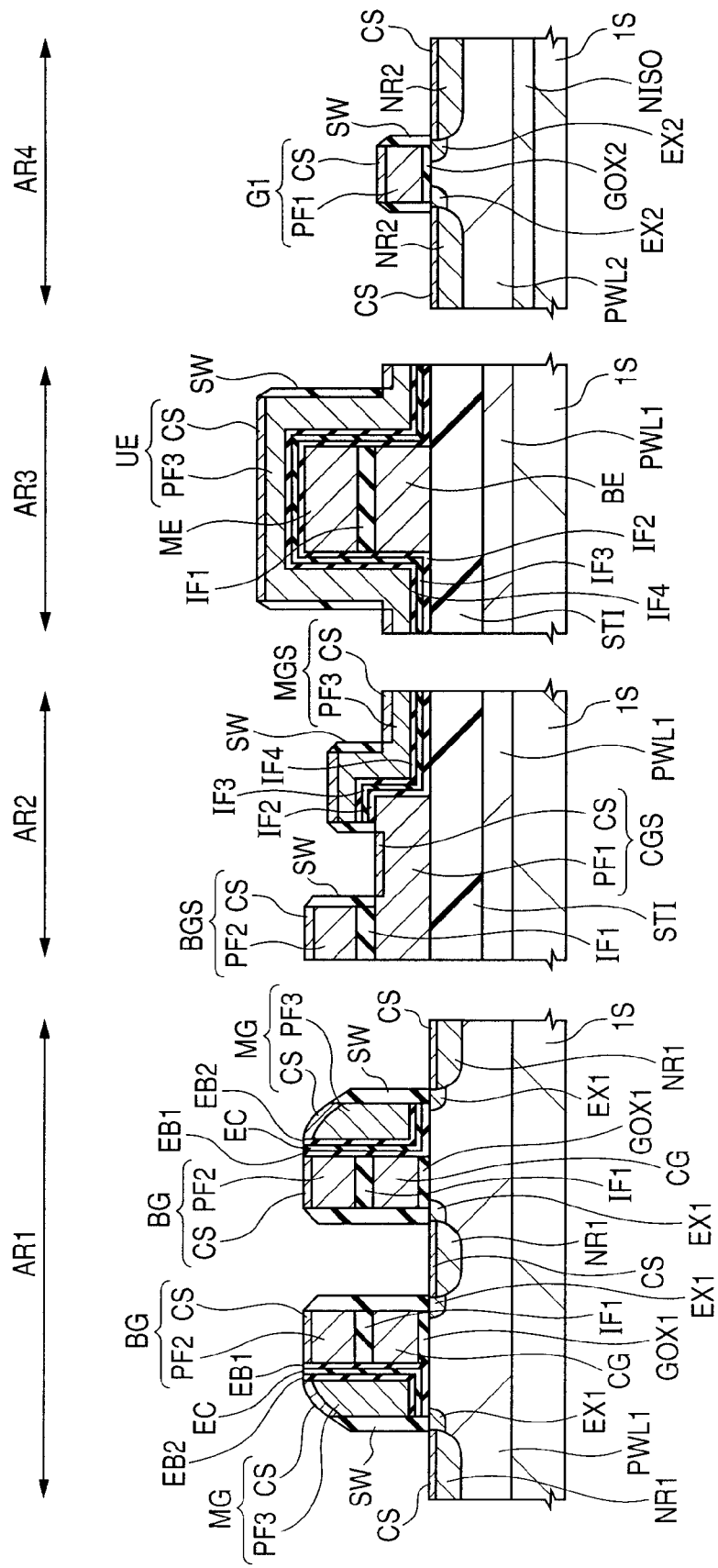
FIG. 23 is a cross-sectional view showing a process step of manufacturing the semiconductor device, which is subsequent to FIG. 22.

Next, as shown in FIG. 23, a cobalt film is formed over the semiconductor substrate 1S. Then, by performing heat treatment, in the memory cell formation area AR1, the polysilicon films PF2 and PF3 forming the boost gate electrode BG and the memory gate electrode MG are caused to react with the cobalt film to form a cobalt silicide film (silicide film CS). As a result, each of the boost gate electrode BG and the memory gate electrode MG has a multilayer structure of the polysilicon films PF2 and PF3 and the cobalt silicide film (silicide film CS). Likewise, at the surface of each of the deep high-concentration impurity diffusion regions NR1 also, silicon and the cobalt film react with each other to form a cobalt silicide film (silicide film CS).

In the lead-out area AR2, a cobalt silicide (silicide film CS) is formed over each of the surface of the lead-out electrode BGS and the surface of the lead-out electrode MGS. At this time, in a region as a part of the exposed lead-out area CGS also, a cobalt silicide film (silicide film CS) is formed.

In the capacitive element formation area AR3, a cobalt silicide film (silicide film CS) is formed over the surface of the upper electrode UE. Also, in the peripheral circuit formation area AR4, a cobalt silicide film (silicide film CS) is formed over the surface of the polysilicon film PF1 forming the gate electrode G1. As a result, the gate electrode G1 includes the polysilicon film PF1 and the cobalt silicide film (silicide film CS). Likewise, at the surface of each of the deep high-concentration impurity diffusion regions NR2 also, silicon and the cobalt film react with each other to form a cobalt silicide film (silicide film CS). Note that, in Embodiment 1, the cobalt silicide films are formed but, instead of the cobalt silicide films, for example, nickel silicide films, titanium silicide films, or platinum silicide films may also be formed.

In this manner, it is possible to form the plurality of memory cells in the memory cell formation area AR1 of the semiconductor substrate 1S, and form the lead-out electrodes CGS, BGS, and MGS in the lead-out area AR2. It is also possible to form the stacked capacitive element in the capacitive element formation area AR3, and form the MISFET in the peripheral circuit formation area AR4.

Next, a wiring step will be described with reference to FIG. 2. As shown in FIG. 2, over the main surface of the semiconductor substrate 1S, the silicon nitride film SN1 and the contact interlayer insulating film CIL are formed. Then, the surface of the contact interlayer insulating film CIL is planarized using, e.g., a Chemical Mechanical Polishing (CMP) method.

Subsequently, using a photolithographic technique and an etching technique, the contact holes CNT1 to CNT5 are formed in the contact interlayer insulating film CIL. For example, in the memory cell formation area AR1, the contact hole CNT1 is formed and, in the lead-out area AR2, the contact holes CNT2 to CNT4 are formed. In addition, in the peripheral circuit formation area AR4, the contact holes CNT5 are formed. At this time, in consideration of the problems associated with coupling capacitance and etching control described above, the relations among the thickness (X) of the boost gate electrode BG, the thickness (Y) of the control gate electrode CG, and the gate length (Z) of the memory gate electrode MG preferably satisfy respective conditions given by X, Y>Z and Y=X.

Thereafter, over the contact interlayer insulating film CIL including the bottom surfaces and inner walls of the contact holes CNT1 to CNT5, a titanium/titanium nitride film is formed. The titanium/titanium nitride film is formed of a multilayer film of a titanium film and a titanium nitride film, and can be formed using, e.g., a splluttering method. The titanium/titanium nitride film has a so-called barrier property which prevents, e.g., tungsten as the material of a film to be buried in the subsequent step from being diffused into silicon.

Then, over the entire main surface of the semiconductor substrate 1S, a tungsten film is formed so as to be buried in the contact holes CNT1 to CNT5. The tungsten film can be formed using, e.g., a CVD method. Then, by removing the unneeded titanium/titanium nitride film and tungsten film that are formed over the contact interlayer insulating film CIL by, e.g., a CMP method, the plugs PLG1 to PLG5 can be formed.

Next, over the contact interlayer insulating film CIL in which the plugs PLG1 to PLG5 are formed, the interlayer insulating film IL1 is formed. Then, by using a photolithographic technique and an etching technique, the wiring trenches WD1 are formed in the interlayer insulating film IL1. Then, over the interlayer insulating film IL1 including the insides of the wiring trenches WD1, a tantalum/tantalum nitride film is formed. The tantalum/tantalum nitride film can be formed by, e.g., a sputtering method. Subsequently, over the tantalum/tantalum nitride film, a seed film comprised of a thin copper film is formed by, e.g., a sputtering method and then, by an electrolytic plating method using the seed film as an electrode, a copper film is formed over the interlayer insulating film IL1 in which the wiring trenches WD1 are formed. Thereafter, the copper film exposed over the interlayer insulating film IL1 except for the portions thereof located in the wiring trenches WD1 is polished and removed by, e.g., a CMP method so that the copper film is left only in the wiring trenches WD1 formed in the interlayer insulating film IL1. In this manner, the lines L1 can be formed. Further, in a layer over the lines L1, wiring is formed, but a description thereof is omitted here. In this manner, the semiconductor device in Embodiment 1 can be eventually formed.

Note that, in Embodiment 1, the example in which the lines L1 each comprised of the copper film has been described, but the lines L1 each comprised of, e.g., an aluminum film may also be formed. In this case, a titanium/titanium nitride film, an aluminum film, and a titanium/titanium nitride film are successively formed over the interlayer insulating film IL1 and the plugs PLG1 to PLG5. These films can be formed by using, e.g., a sputtering method. Subsequently, by using a photolithographic technique and an etching technique, these films are patterned to form the lines L1. In this manner, the lines L1 each comprised of the aluminum film can be formed.

(Embodiment 2)

In Embodiment 1 described above, the description has been given of the example in which the control gate electrode CG, the boost gate electrode BG, and the memory gate electrode MG of the memory cell are formed in the memory cell formation area AR1, and then the gate electrode G1 of the MIFET is formed in the peripheral circuit formation area AR4. In Embodiment 2, a description will be given of an example in which, in the step of forming the control gate electrode CG of the memory cell, the gate electrode G1 is formed in the peripheral circuit formation area AR4.

Figure 24:
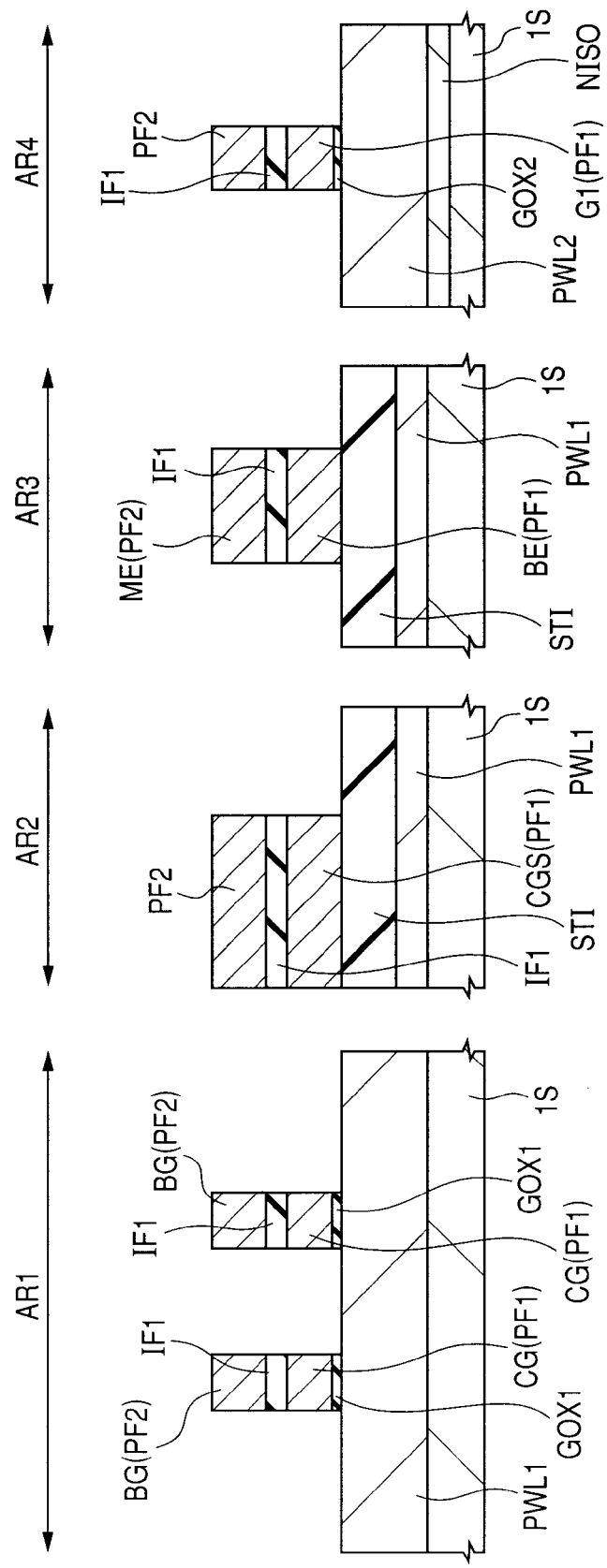
FIG. 24 is a cross-sectional view showing a process step of manufacturing a semiconductor device in Embodiment 2.

First, in Embodiment 2 also, the steps shown in FIGS. 15 and 16 are the same as in Embodiment 1 described above. Next, as shown in FIG. 24, by using a photolithographic technique and an etching technique, the polysilicon film PF2, the insulating film IF1, and the polysilicon film PF1 are successively processed. Specifically, in the memory cell formation area AR1, the polysilicon film PF2, the insulating film IF1, and the polysilicon film PF1 are processed to form the boost gate electrode BG comprised of the polysilicon film PF2 and the control gate electrode CG comprised of the polysilicon film PF1. In the lead-out area AR2 also, the polysilicon film PF2, the insulating film IF1, and the polysilicon film PF1 are processed. At this time, by processing the polysilicon film PF1, the lead-out electrode CGS is formed. In the capacitive element formation area AR3, the polysilicon film PF2 is processed to form the middle electrode ME, and the polysilicon film PF1 is processed to form the base electrode BE. The insulating film IF1 interposed between the base electrode BE and the middle electrode ME serves as a capacitor insulating film. Also in the peripheral circuit formation area AR4, the polysilicon film PF2, the insulating film IF1, and the polysilicon film PF1 are processed. In this manner, the gate electrode G1 comprised of the polysilicon film PF1 is formed.

Subsequently, as shown in FIG. 25, by further using a photolithographic technique and an etching technique, the polysilicon film PF2 and the insulating film IF1 are processed. Specifically, in the lead-out area AR2, the insulating film IF1 and the polysilicon film PF2 each formed over the lead-out electrode CGS are processed to form the lead-out electrode BGS. At this time, the end portion of the lead-out electrode CGS formed in a layer under the lead-out electrode BGS is exposed. In addition, the polysilicon film PF2 and the insulating film IF1 formed in the peripheral circuit formation area AR4 are removed to expose the gate electrode G1. Since the subsequent steps are substantially the same as those in Embodiment 1 described above, a description thereof is omitted. In this manner, the semiconductor device in Embodiment 2 can be manufactured.

While the invention achieved by the present inventors has been specifically described heretofore based on the embodiments thereof, the present invention is not limited to the embodiments described above. It will be appreciated that various modifications and changes can be made in the invention without departing from the gist thereof.

The present invention is widely applicable to a manufacturing industry for manufacturing semiconductor devices.

What is claimed is:

1. A semiconductor device comprising:
   a memory cell formed over a memory cell formation area of a semiconductor substrate,
   wherein the memory cell includes:
   (a) the semiconductor substrate;
   (b) a first gate insulating film formed over the semiconductor substrate;
   (c) a control gate electrode formed over the first gate insulating film;
   (d) a first insulating film formed over the control gate electrode;
   (e) a boost gate electrode formed over the first insulating film;
   (f) a first potential barrier film formed over respective side walls of the control gate electrode and the boost gate electrode and over the semiconductor substrate;
   (g) a charge accumulation film formed over the first potential barrier film;
   (h) a second potential barrier film formed over the charge accumulation film;
   (i) a memory gate electrode formed over the second potential barrier film;
   (j) a first source region formed in the semiconductor substrate; and
   (k) a first drain region formed in the semiconductor substrate, and
   wherein a height of a surface of the control gate electrode from a surface of the semiconductor substrate is lower than a height of a surface of the memory gate electrode from the surface of the semiconductor substrate.

2. A semiconductor device according to claim 1,
   wherein a height of a surface of the boost gate electrode from the surface of the semiconductor substrate is equal to the height of the surface of the memory gate electrode from the surface of the semiconductor substrate.

3. A semiconductor device according to claim 2,
   wherein the memory gate electrode has a sidewall shape.

4. A semiconductor device according to claim 1,
   wherein the boost gate electrode has a voltage boosting function of increasing an absolute value of a voltage applied to the memory gate electrode through capacitive coupling.

5. A semiconductor device according to claim 4,
   wherein the voltage boosting function of the boost gate electrode is implemented by applying a first voltage to the memory gate electrode, subsequently bringing the memory gate electrode into a floating state, subsequently applying a second voltage to the boost gate electrode while maintaining the memory gate electrode in the floating state, and thereby changing a voltage of the memory gate electrode into a third voltage having an absolute value larger than that of the first voltage.

6. A semiconductor device according to claim 5,
   wherein the voltage boosting function of the boost gate electrode is used during a write operation of writing information in the memory cell.

7. A semiconductor device according to claim 5,
   wherein the voltage boosting function of the boost gate electrode is used during an erase operation of erasing information written in the memory cell.

8. A semiconductor device according to claim 1,
   wherein a plurality of the memory cells are formed in the semiconductor substrate, and
   wherein the memory gate electrodes formed in the respective memory cells are electrically coupled.

9. A semiconductor device according to claim 1,
   wherein a plurality of the memory cells are formed in the semiconductor substrate, and
   wherein the memory gate electrodes formed in the respective memory cells are electrically isolated.

10. A semiconductor device according to claim 1,
    wherein a thickness of the first insulating film is larger than a thickness of the first gate insulating film.

11. A semiconductor device according to claim 10,
    wherein the thickness of the first insulating film is not less than a combined thickness of respective thicknesses of the first potential barrier film, the charge accumulation film, and the second potential barrier film which are formed between the semiconductor substrate and the memory gate electrode.

12. A semiconductor device according to claim 11,
    wherein the first insulating film is formed of a multilayer film.

13. A semiconductor device according to claim 12,
    wherein the first insulating film is formed of a first silicon dioxide film, a silicon nitride film formed over the first silicon dioxide film, and a second silicon dioxide film formed over the silicon nitride film.

14. A semiconductor device according to claim 1,
    wherein the control gate electrode, the boost gate electrode, and the memory gate electrode are formed of respective polysilicon films, and
    wherein respective silicide films are formed over a surface of the polysilicon film forming the boost gate electrode and a surface of the polysilicon film forming the memory gate electrode, while a silicide film is formed only in a surface of a lead-out area of the polysilicon film forming the control gate electrode which is coupled to a plug.

15. A semiconductor device according to claim 1,
    wherein the first potential barrier film and the second potential barrier film are formed of respective silicon dioxide films, and
    wherein the charge accumulation film is formed of a silicon nitride film.

16. A semiconductor device according to claim 1,
    wherein a stacked capacitive element is formed over a capacitive element formation area of the semiconductor substrate,
    wherein the capacitive element has:
    (l1) a first capacitive element including a base electrode, the first insulating film, and a middle electrode; and
    (l2) a second capacitive element including the middle electrode, the first insulating film, and an upper electrode, and wherein the base electrode and the control gate electrode are each formed of the same film,
wherein the middle electrode and the boost gate electrode are each formed of the same film, and
wherein the upper electrode and the memory gate electrode are each formed of the same film.

17. A semiconductor device according to claim 1,
wherein a MISFET is formed over a peripheral circuit formation area of the semiconductor substrate,
wherein the MISFET has:
(m1) a second gate insulating film formed over the semiconductor substrate;
(m2) a gate electrode formed over the second gate insulating film;
(m3) a second source region formed in the semiconductor substrate; and
(m4) a second drain region formed in the semiconductor substrate, and
wherein the gate electrode is in the same layer as that of the control gate electrode.

18. A semiconductor device according to claim 1,
wherein a thickness of the control gate electrode and a thickness of the boost gate electrode are each larger than a gate length of the memory gate electrode.

19. A semiconductor device according to claim 18,
wherein the thickness of the boost gate electrode is not more than the thickness of the control gate electrode.

20. A method of manufacturing a semiconductor device, comprising the steps of:
(a) forming a first gate insulating film over a semiconductor substrate;
(b) forming a first conductive film over the first gate insulating film;
(c) forming a first insulating film over the first conductive film;
(d) forming a second conductive film over the first insulating film;
(e) processing the second conductive film, the first insulating film, the first conductive film, and the first gate insulating film to form a boost gate electrode including the second conductive film and a control gate electrode including the first conductive film;
(f) after the step (e), forming a multilayer insulating film including a charge accumulation film over the semiconductor substrate;
(g) forming a third conductive film over the multilayer insulating film;
(h) performing anisotropic etching to the third conductive film to form a memory gate electrode including the third conductive film over respective side walls of the control gate electrode and the boost gate electrode and over the semiconductor substrate each via the multilayer insulating film; and
(i) forming a source region and a drain region in the semiconductor substrate.

21. A method of manufacturing a semiconductor device according to claim 20,
wherein the first conductive film, the second conductive film, and the third conductive film are polysilicon films.

22. A method of manufacturing a semiconductor device according to claim 20,
wherein a thickness of the first insulating film is larger than a thickness of the first gate insulating film.

23. A method of manufacturing a semiconductor device according to claim 22,
wherein the thickness of the first insulating film is not less than a thickness of the multilayer insulating film.

24. A method of manufacturing a semiconductor device according to claim 20,
wherein, in the step (f), after a first silicon dioxide film is formed, a silicon nitride film serving as the charge accumulation film is formed over the first silicon dioxide film, and then a second silicon dioxide film is formed over the silicon nitride film to form the multilayer insulating film.

25. A method of manufacturing a semiconductor device, including forming a memory cell over a memory cell formation area of a semiconductor substrate, forming a stacked capacitive element over a capacitive element formation area of the semiconductor substrate, and further forming a MISFET over a peripheral circuit formation area of the semiconductor substrate, the method comprising the steps of:
(a) forming a first gate insulating film over the memory cell formation area of the semiconductor substrate, and forming a second gate insulating film over the peripheral circuit formation area of the semiconductor substrate;
(b) after the step (a), forming a first conductive film over an entire main surface of the semiconductor substrate;
(c) forming a first insulating film over the first conductive film;
(d) forming a second conductive film over the first insulating film;
(e) processing the second conductive film, the first insulating film, the first conductive film, and the first gate insulating film in the memory cell formation area to form a boost gate electrode including the second conductive film and form a control gate electrode including the first conductive film, processing the second conductive film, the first insulating film, and the first conductive film in the capacitive element formation area to form a middle electrode including the second conductive film and a base electrode including the first conductive film, and removing the second conductive film and the first insulating film in the peripheral circuit formation area;
(f) after the step (e), forming a multilayer insulating film including a charge accumulation film over the entire main surface of the semiconductor substrate;
(g) forming a third conductive film over the multilayer insulating film;
(h) anisotropically etching the third conductive film in the memory cell formation area to form a memory gate electrode including the third conductive film over respective side walls of the control gate electrode and the boost gate electrode and over the semiconductor substrate each via the multilayer insulating film, processing the third conductive film in the capacitive element formation area to form an upper electrode including the third conductive film, and removing the third conductive film and the multilayer insulating film in the peripheral circuit formation area;
(i) after the step (h), processing the first conductive film and the second gate insulating film in the peripheral circuit formation area to form a gate electrode including the first conductive film; and
(j) introducing an impurity of a conductivity type into the semiconductor substrate in the memory cell formation area to form a first source region and a first drain region, and introducing an impurity of the conductivity type into the semiconductor substrate in the peripheral circuit formation area to form a second source region and a second drain region.

26. A method of manufacturing a semiconductor device, including forming a memory cell over a memory cell formation area of a semiconductor substrate, forming a stacked capacitive element over a capacitive element formation area of the semiconductor substrate, and further forming a MISFET over a peripheral circuit formation area of the semiconductor substrate, the method comprising the steps of:

(a) forming a first gate insulating film over the memory cell formation area of the semiconductor substrate, and forming a second gate insulating film over the peripheral circuit formation area of the semiconductor substrate;

(b) after the step (a), forming a first conductive film over an entire main surface of the semiconductor substrate;

(c) forming a first insulating film over the first conductive film;

(d) forming a second conductive film over the first insulating film;

(e) processing the second conductive film, the first insulating film, the first conductive film, and the first gate insulating film in the memory cell formation area to form a boost gate electrode including the second conductive film and form a control gate electrode including the first conductive film, processing the second conductive film, the first insulating film, and the first conductive film in the capacitive element formation area to form a middle electrode including the second conductive film and a base electrode including the first conductive film, and removing the second conductive film and the first insulating film and processing the first conductive film and the second gate insulating film in the peripheral circuit formation area to form a gate electrode including the first conductive film;

(f) after the step (e), forming a multilayer insulating film including a charge accumulation film over the entire main surface of the semiconductor substrate;

(g) forming a third conductive film over the multilayer insulating film;

(h) anisotropically etching the third conductive film in the memory cell formation area to form a memory gate electrode including the third conductive film over respective side walls of the control gate electrode and the boost gate electrode and over the semiconductor substrate each via the multilayer insulating film, processing the third conductive film in the capacitive element formation area to form an upper electrode including the third conductive film, and removing the third conductive film and the multilayer insulating film in the peripheral circuit formation area; and (i) introducing an impurity of a conductivity type into the semiconductor substrate in the memory cell formation area to form a first source region and a first drain region, and introducing an impurity of the conductivity type into the semiconductor substrate in the peripheral circuit formation area to form a second source region and a second drain region.

* * * * *